(12) United States Patent
Park et al.

(10) Patent No.: US 10,090,046 B2
(45) Date of Patent: Oct. 2, 2018

(54) NONVOLATILE MEMORY DEVICE AND READ METHOD THEREOF

(71) Applicants: Sang-Soo Park, Hwaseong-si (KR);
June-Hong Park, Seongnam-si (KR);
Dongkyo Shim, Seoul (KR)

(72) Inventors: Sang-Soo Park, Hwaseong-si (KR);
June-Hong Park, Seongnam-si (KR);
Dongkyo Shim, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/341,253

(22) Filed: Nov. 2, 2016

(65) Prior Publication Data

US 2017/0133087 A1    May 11, 2017

(30) Foreign Application Priority Data

Nov. 9, 2015  (KR) .................. 10-2015-0156935

(51) Int. Cl.
| G11C 11/34 | (2006.01) |
| G11C 11/56 | (2006.01) |
| G11C 16/28 | (2006.01) |
| G11C 16/10 | (2006.01) |
| G11C 16/08 | (2006.01) |
| G11C 29/02 | (2006.01) |
| G11C 29/52 | (2006.01) |

(52) U.S. Cl.
CPC ...... *G11C 11/5671* (2013.01); *G11C 11/5642* (2013.01); *G11C 16/10* (2013.01); *G11C 16/28* (2013.01); G11C 16/08 (2013.01); G11C 29/021 (2013.01); G11C 29/028 (2013.01); G11C 29/52 (2013.01)

(58) Field of Classification Search
CPC . G11C 11/5671; G11C 11/5642; G11C 16/10; G11C 16/28
USPC ............................................. 365/185.03, 154
See application file for complete search history.

(56) References Cited

U.S. PATENT DOCUMENTS

| 7,242,615 | B2 | 7/2007 | Nagashima |
| 7,349,264 | B2 | 3/2008 | Mokhlesi et al. |
| 7,599,236 | B2 | 10/2009 | Eguchi et al. |
| 7,679,133 | B2 | 3/2010 | Son et al. |
| 7,679,966 | B2 | 3/2010 | Kang et al. |
| 7,733,703 | B2 | 6/2010 | Li |
| 7,848,149 | B2 | 12/2010 | Gonzalez et al. |

(Continued)

*Primary Examiner* — Anthan Tran
(74) *Attorney, Agent, or Firm* — Harness, Dickey & Pierce, P.L.C.

(57) ABSTRACT

Disclosed is a nonvolatile memory device. The nonvolatile memory device includes a cell array including a plurality of memory cells, a page buffer including a plurality of latch sets, and a control logic. The page buffer is connected to the cell array through bit lines. The latch sets respectively are configured to sense data from selected memory cells among the memory cells through the bit lines. The latch sets respectively are configured to perform a plurality of read operations to determine one data state. The latch sets are respectively configured to store results of the read operations. The control logic configured to control the page buffer such that the latch sets sequentially and respectively store the results of the read operations, to compare data stored in the latch sets with each other, and to select one latch set among the latch sets based on the comparison result.

20 Claims, 23 Drawing Sheets

(56) References Cited

U.S. PATENT DOCUMENTS

| | | |
|---|---|---|
| 7,889,563 B2 | 2/2011 | Cho et al. |
| 8,553,466 B2 | 10/2013 | Han et al. |
| 8,559,235 B2 | 10/2013 | Yoon et al. |
| 8,654,587 B2 | 2/2014 | Yoon et al. |
| 2009/0003058 A1 | 1/2009 | Kang |
| 2011/0233648 A1 | 9/2011 | Seol et al. |
| 2012/0072806 A1 | 3/2012 | Tabata et al. |
| 2013/0155770 A1* | 6/2013 | Hirano .................. G11C 16/24 365/185.03 |
| 2013/0194872 A1 | 8/2013 | Sim et al. |
| 2013/0235674 A1 | 9/2013 | Hung et al. |
| 2014/0153330 A1* | 6/2014 | Yoon .................. G11C 11/5642 365/185.03 |
| 2014/0198569 A1 | 7/2014 | Kim et al. |
| 2015/0113322 A1* | 4/2015 | Lee .......................... G11C 7/14 714/15 |

* cited by examiner

FIG. 15

| Page | Read Sequence |||||||
|---|---|---|---|---|---|---|---|
|  | LSB || CSB ||| MSB ||
| Read level | RD1 | RD5 | RD2 | RD4 | RD6 | RD3 | RD7 |
| Suggested Sequence | 1 | 2 | 1 | 3 | 2 | 2 | 1 |
|  |  |  | 2 | 3 | 1 |  |  |

NONVOLATILE MEMORY DEVICE AND READ METHOD THEREOF

CROSS-REFERENCE TO RELATED APPLICATIONS

The present application claims priority under 35 U.S.C. § 119 to Korean Patent Application No. 10-2015-0156935, filed on Nov. 9, 2015, in the Korean Intellectual Property Office, the entire contents of which are hereby incorporated by reference.

BACKGROUND

The present disclosure relates to a semiconductor memory device, and in particular, to a nonvolatile memory device which is capable of improving data reliability and a read performance. Example embodiments also relate to a data reading method of the semiconductor memory device.

A semiconductor memory device may be a volatile semiconductor memory device or a nonvolatile semiconductor memory device. The read and write speed of the volatile memory device is fast, but the volatile memory device loses data when a power voltage supply is interrupted. On the other hand, data stored in the nonvolatile semiconductor memory device does not disappear if a power voltage supply is interrupted. Therefore, the nonvolatile semiconductor memory device stores content to be preserved regardless of whether a power supply is supplied or not.

The nonvolatile semiconductor memory device typically includes a flash memory device. The flash memory device may be used as voice and image data storage media of information devices such as a computer, a cellular phone, a smart phone, a personal digital assistant (PDA), a digital camera, a camcorder, a voice recorder, an MP3 player, a handheld PC, a game console, a facsimile, a scanner, and a printer. Technologies of high-capacity, high-speed, and low-power nonvolatile memory devices are being developed to mount the nonvolatile memory device in a mobile device such as a smart phone.

SUMMARY

Disclosed is a nonvolatile memory device and data processing method thereof performing a data processing operation for reducing (and/or minimizing) the occurrence of an error bit.

Example embodiments of inventive concepts relate to a nonvolatile memory device and data processing method which performs a sensing operation a plurality of times and selects and outputs optimal data among data included in the sensed results to determine a specific data state in a device.

According to example embodiments of inventive concepts, a nonvolatile memory device may include a cell array, bit lines connected to the cell array, a page buffer, and a control logic. The cell array includes a plurality of memory cells. The page buffer includes a plurality of latch sets. The page buffer is connected to the cell array through the bit lines. The latch sets are respectively configured to sense data from selected memory cells among the memory cells through the plurality of bit lines. The latch sets are respectively configured to perform a plurality of read operations to determine one data state. The latch sets are respectively configured to store results of the read operations. The control logic is configured to control the page buffer such that the latch sets sequentially and respectively store the results of the read operations, to compare data stored in the latch sets with each other, and to select one latch set among the latch sets based on the comparison result.

In example embodiments, the page buffer may be configured to perform the read operations with respect to the selected memory cells during different develop periods.

In example embodiments, the nonvolatile memory device may further include word lines and a row decoder connected to the cell array through the word lines. The row decoder may be configured to provide a read voltage of a same level to selected word lines among the word lines that are connected to the selected memory cells. In example embodiments, the nonvolatile memory device may further include word lines and a row decoder connected to the cell array through the word lines. The row decoder may be configured to perform the read operations using read voltages of different levels provided to word line connected to the selected memory cells among the word lines.

In example embodiments, the page buffer may include a first latch set and a second latch set. The first latch set may be configured to store first data sensed and latched according to a first read operation about the selected memory cells. The second latch set may be configured to store second data sensed and latched according to a second read operation about the selected memory cells. The control logic may be configured to compare the first data with the second data to select one of the first data and the second data.

In example embodiments, the control logic may be configured to select the one of the first data and the second data, based on comparing a number of on cells counted using the first data with a number of off cells counted using the second data.

In example embodiments, the control logic may be configured to select the second data if the number of on cells is greater than the number of off cells.

In example embodiments, the page buffer may include a first latch set configured to store first data sensed and latched according to a first read operation about the selected memory cells, a second latch set configured to store second data sensed and latched according to a second read operation about the selected memory cells, and a third latch set configured to store third data sensed and latched according to a third read operation about the selected memory cells. The control logic may be is configured to calculate a first cell count by comparing the first data with the second data. The control logic may be configured to calculate a second cell count by comparing the second data with the third data.

In example embodiments, the control logic may be configured to select the third data if the first cell count is greater than the second cell count.

In example embodiments, the control logic may be configured to select the first data if the first cell count is smaller than the second cell count.

In example embodiments, the control logic may be configured to select the second data if the first cell count is equal to the second cell count. Alternatively, the control logic may be configured to select the second data if a difference between the first cell count and the second cell count is smaller than or equal to a reference value.

In example embodiments, the nonvolatile memory device may further include a cell counter configured to count a number of cells by comparing data stored in the latch sets with each other.

In example embodiments, the control logic may be configured to selectively apply the read operations based on a level of a read voltage for determining the one data state.

In example embodiments, each of the memory cells may include a charge trap layer, and the cell array may be a three-dimensional memory array.

According to example embodiments of inventive concepts, a method of reading a nonvolatile memory device may include storing first data in a first latch set of a page buffer, the first data obtained by performing a first read operation for determining a data state of selected memory cells; storing second data in a second latch set of the page buffer, the second data obtained by performing a second read operation for determining the data state of the selected memory cells; counting a number of memory cells based on comparing the first data with the second data; and selecting one of the first data and the second data based on the counted number of memory cells.

In example embodiments, the first data may be sensed during a first develop period of the selected memory cells and may be stored in the first latch set. The second data may be sensed during a second develop period of the selected memory cells and may be stored in the second latch set. The first develop period may be shorter than the second develop period.

In example embodiments, the first data may be obtained by sensing the selected memory cells using a first search read voltage and may be stored in the first latch set. The second data may be obtained by sending the selected memory cells using a second search read voltage that is higher than the first search read voltage and may be stored in the second latch set.

In example embodiments, the selecting the one of the first data and the second data may include comparing a number of on cells counted using the first data with a number of off cells counted using the second data to the one of the first data and the second data.

According to example embodiments of inventive concepts, a method of reading a nonvolatile memory device may include: storing first data in a first latch set of a page buffer, the first data obtained by performing a first read operation for determining a data state of selected memory cells; storing second data in a second latch set of the page buffer, the second data obtained by performing a second read operation for determining the data state of the selected memory cells; storing third data in a third latch set of the page buffer, the third data obtained by performing a third read operation for determining the data state of the selected memory cells; calculating a first cell count using the first data and the second data; and calculating a second cell count using the second data and the third data, and selecting one of the first data, the second data, and the third data based on the first cell count and the second cell count.

In example embodiments, each of the first to third read operations may include operations to sense whether the selected memory cells are turned on or off during different develop periods under a same read voltage condition.

In example embodiments, the first read operation may include sensing the selected memory cell using a first read voltage, the second read operation may include sensing the selected memory cells using a second read voltage that is higher than the first read voltage, and the third read operation may include sensing the selected memory cells using a third read voltage that is higher than the second read voltage.

In example embodiments, the selecting one of the first data, the second data, and the third data may include selecting the third data if the first cell count is greater than the second cell count.

In example embodiments, the selecting one of the first data, the second data, and the third data may include selecting the first data if the first cell count is less than the second cell count.

In example embodiments, the selecting one of the first data, the second data, and the third data may include selecting the second data if the first cell count is equal to the second cell count, or if a difference between the first cell count and the second cell count is smaller than a reference value.

According to example embodiments of inventive concepts, a nonvolatile memory device, includes a cell array including a plurality of memory cells; a plurality of bit lines connected to the cell array; a plurality of word lines connected to the cell array; a page buffer connected to the cell array through the bit lines, the page buffer including a first latch, a second latch, and a third latch; a row decoder connected to cell array through the word lines; and a control logic connected to the page buffer and the row decoder. The control logic is configured to perform an on-chip valley search (OCVS) operation on selected memory cells among the memory cells in the cell array using the row decoder and the page buffer. The OCVS operation includes storing first to third data in the first to third data latches respectively, determining a first cell count using the first data and the second data, determining a second cell count using the second data and the third data, and selecting one of the first to third data as a desired read level based on the first cell count and the second cell count. The first to third data being is obtained by performing first to third read operations respectively on the selected memory cells. The first to third read operations have one of different read voltage conditions and different read develop conditions. The first count corresponds to a number of the selected memory cells having a threshold voltage in a first range. The second cell count corresponds to a number of the selected memory cells having a threshold voltage in a second range that is different than the first range.

In example embodiments, the control logic may be configured to perform the first to third read operations using different read develop conditions for the first to third read operations.

In example embodiments, the control logic may be configured to sense the selected memory cells using first to third read voltages during the first to third read operations, respectively. A value the second read voltage may be between respective values of the first and third read voltages. The control logic may be configured to select the third data as the desired read level if the first cell count is greater than the second cell count. The control logic may be configured to select the first data as the desired read level selecting the third data if the first cell count is smaller than the second cell count. The control logic maybe configured to select the second data if the first cell count is equal to the second cell count or if a difference between the first cell count and the second cell count is smaller than a reference value.

In example embodiments, the page buffer may include a sensing node connected to a corresponding one of the bit lines and the first to third latches. The page buffer may include a PMOS transistor connected to the sensing node. The page buffer may include a first NMOS transistor and a second NMOS transistor serially connected between the sensing node and the bit line. The page buffer may include a third NMOS transistor connected to a node between the first and second NMOS transistors.

In example embodiments, each of the memory cells may include a charge trap layer, and the cell array may be a three-dimensional memory array.

BRIEF DESCRIPTION OF THE FIGURES

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings:

FIG. 15 is a table for describing a feature of an OCVS read operation selectively applied according to a threshold voltage state illustrated in FIG. 14;

DETAILED DESCRIPTION

Figure 1:
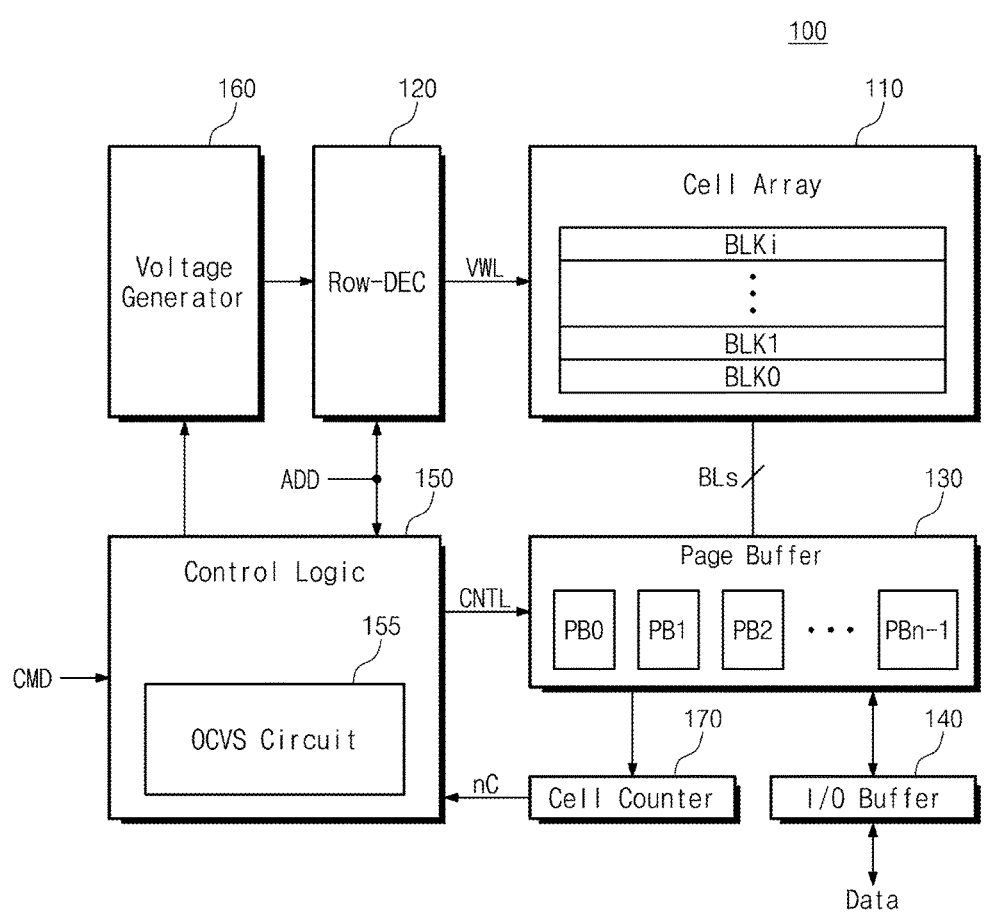
FIG. 1 is a block diagram illustrating a nonvolatile memory device according to example embodiments of inventive concepts.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may not be repeated.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an etched region or an implanted region illustrated as a rectangle may have rounded or curved features. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Below, a NAND-type flash memory device may be used as an example of a nonvolatile memory device according to example embodiments of inventive concepts. However, other features and performs may be easily understood from information disclosed herein. For example, a technology according to example embodiments of inventive concepts may be used in a PRAM, a MRAM, a ReRAM, a FRAM, a NOR flash memory, and the like.

FIG. 1 is a block diagram illustrating a nonvolatile memory device according to example embodiments of inventive concepts. Referring to FIG. 1, the nonvolatile memory 100 may include a cell array 110, a row decoder 120, a page buffer 130, an input/output (I/O) buffer 140, a control logic 150, a voltage generator 160, and a cell counter 170.

The cell array 110 may be connected to the row decoder 120 through word lines (WLs) and/or selection lines (SSL and GSL). The cell array 110 may be connected to the page buffer 130 through bit lines BLs. The cell array 110 may include a plurality of NAND cell strings. A channel of each of the NAND cell strings may be formed in a vertical or horizontal direction. The cell array 110 according to example embodiments of inventive concepts may include a plurality of memory cells for forming a NAND cell string. The memory cells may be programmed, erased, and read based on a voltage to be provided to the bit lines BLs and/or the word lines. A program operation may be performed by a page, and an erase operation may be performed by a block (e.g., one of BLK0 to BLKi) or by a plurality of blocks (e.g., two of BLK0 to BLKi).

In example embodiments of inventive concepts, the cell array 110 may be provided as a three dimensional (3D) memory array. The 3-D memory array may be monolithically formed in one or more physical level(s) of a memory cell array having an active area arranged on a circuit related on a silicon substrate and an operation of memory cells. The circuit related on an operation of memory cells may be located in a substrate or on a substrate. The term "monolithic" means that layers of each level of the array are directly deposited on the layers of each underlying level of the array.

In example embodiments, a nonvolatile memory may be embodied to include a three dimensional (3D) memory array. The 3D memory array may be monolithically formed on a substrate (e.g., semiconductor substrate such as silicon, or semiconductor-on-insulator substrate). The 3D memory array may include two or more physical levels of memory cells having an active area disposed above the substrate and circuitry associated with the operation of those memory cells, whether such associated circuitry is above or within such substrate. The layers of each level of the array may be directly deposited on the layers of each underlying level of the array.

In example embodiments, the 3D memory array may include vertical NAND strings that are vertically oriented such that at least one memory cell is located over another memory cell. The at least one memory cell may comprise a charge trap layer.

The following patent documents, which are hereby incorporated by reference in their entirety, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654, 587; 8,559,235; and US Pat. Pub. No. 2011/0233648.

The row decoder 120 may select one of the memory blocks in the cell array 110 in response to an address ADD. The row decoder 120 may select one of the word lines of the selected memory block in response to the address ADD. The row decoder 120 may transmit a voltage VWL corresponding to an operating mode to a word line of the selected memory block. During a program operation, the row decoder 120 may transmit a program voltage and a verification voltage to a selected word line and a pass voltage to an unselected word line. During a read operation, the row decoder 120 may transmit a selection read voltage to the selected word line and a non-selection read voltage to the unselected word line.

The page buffer 130 may operate as a write driver or a sense amplifier. During a program operation, the page buffer 130 may transmit a bit line voltage corresponding to data to be programmed to a bit line of the memory cell array 110. During a read operation or a verification read operation, the page buffer 130 may sense data stored in a selected memory cell through the bit lines BLs. Each of a plurality of page buffers PB0 to PBn-1 included in the page buffer 130 may be connected to one or two bit lines.

Each of the page buffers PB0 to PBn-1 may perform a sensing and latching operation for performing an on-chip valley search (OCVS) operation according to example embodiments of inventive concepts. That is, to determine the data state of one stored in memory cells selected according to control of the control logic 150, each of the page buffers PB0 to PBn-1 may perform a plurality of sensing operations. Moreover, after respectively storing data sensed through the sensing operations, the page buffers PB0 to PBn-1 may select one data under control of the control logic 150. That is, to determine the data state of the one data, each of the page buffers PB0 to PBn-1 may perform sensing operations a plurality of times. Moreover, each of the page buffers PB0 to PBn−1 may select or output optimal data among a plurality of data sensed according to control of the control logic 150. This sensing, latching, and selecting operation will be described in detail with reference to accompanying drawings.

The I/O buffer 140 may provide data, which is provided from an external device, to the page buffer 130. The I/O buffer 140 may provide a command CMD, which is provided from an external device, to the control logic 150. The I/O buffer 140 may provide the address ADD, which is provided from an external device, to the control logic 150 or the row decoder 120. In addition, the I/O buffer 140 may output data, which is sensed and latched by the page buffer 130, to an external device.

The control logic 150 may control the page buffer 130 and the row decoder 120 in response to the command CMD from the external device. The control logic 150 may control the page buffer 130 and the row decoder 120 to perform program, read, and erase operations with respect to a memory cell selected according to the command CMD.

In particular, the control logic 150 may control the page buffer 130 and the voltage generator 160 for the OCVS operation according to example embodiments of inventive concepts. To determine a specific state of each of the selected memory cells, the control logic 150 may control the page buffer 130 to perform a sensing operation a plurality of times. Moreover, the control logic 150 may control the page buffers PB0 to PBn−1 to store sensing data corresponding to each of the sensed results obtained by performing the sensing operation a plurality of times in a plurality of latch sets included in each of the page buffers PB0 to PBn−1. Moreover, the control logic 150 may perform an operation for selecting optimal data among data obtained by performing the sensing operation a plurality of times. To select the optimal data, the control logic 150 may use a count result nC provided from the cell counter 170. That is, the control logic 150 may control the page buffer 130 to select and output a sensed result, which is the closest to a valley, from among the sensed results. To perform this operation, the control logic 150 may include an OCVS circuit 155.

Under control of the control logic 150, the voltage generator 160 may generate various kinds of word line voltages to be respectively provided to word lines and a voltage to be provided to a bulk (e.g., well area), in which memory cells are formed. There may be the program voltage, the pass voltage, and selection and non-selection read voltages in word line voltages to be respectively provided to the word lines.

The cell counter 170 may count memory cells, each of which corresponds to a specific threshold voltage range, from sensed data in the page buffer 130. For example, the cell counter 170 may process sensed data in each of the page buffers PB0 to PBn−1 to count the number of memory cells each of which has a threshold voltage of a specific threshold voltage range.

The nonvolatile memory device 100 according to example embodiments of inventive concepts may perform a plurality of sensing operations with respect to the selected memory cells. Moreover, the nonvolatile memory device 100 may select optimal data among a plurality of sensed data to output the selected data as data requested from an external device. The nonvolatile memory device 100 according to example embodiments of inventive concepts may select data sensed using an optimal read voltage in the nonvolatile memory device 100, thereby providing data of a high reliability.

Figure 2:
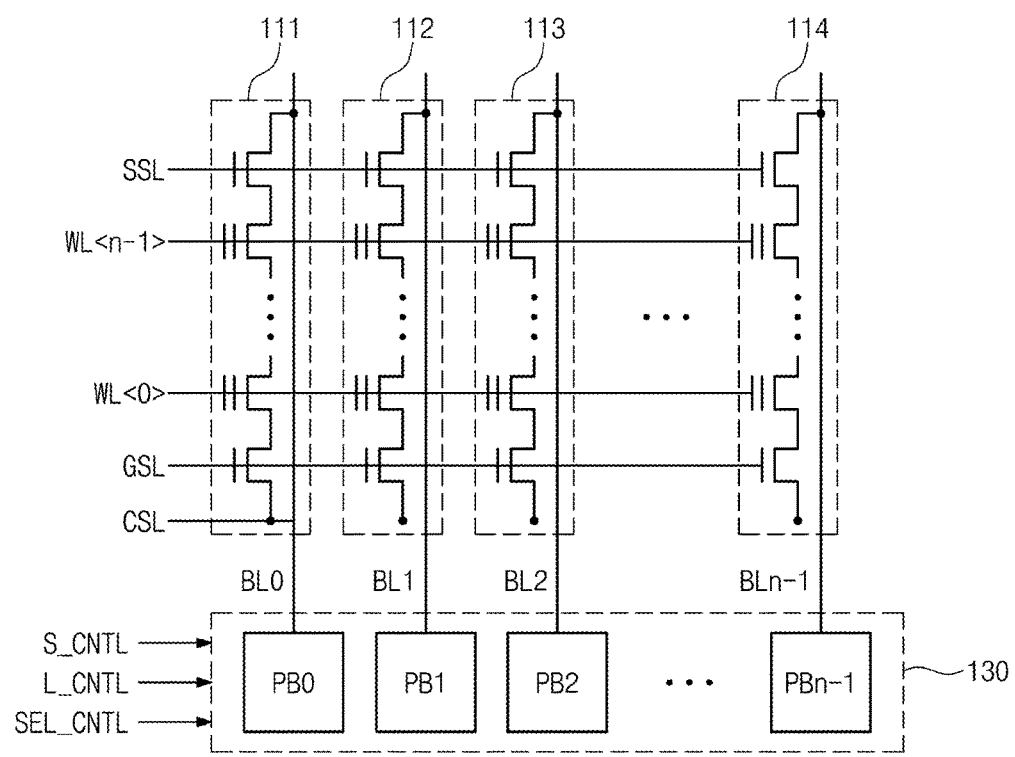
FIG. 2 is a block diagram illustrating a cell array and a page buffer illustrated in FIG. 1.

FIG. 2 is a block diagram illustrating a cell array and a page buffer illustrated in FIG. 1. Referring to FIG. 2, the page buffers PB0 to PBn−1 may be connected to bit lines BL0 to BLn−1, respectively. The bit lines BL0 to BLn−1 may be connected to NAND cell strings 111, 112, 113, . . . , and 114, respectively.

The NAND cell strings 111, 112, 113, . . . , and 114 included in the cell array 110 may be connected with the bit lines BL0 to BLn−1 through string selection transistors (e.g., SST), respectively. A gate terminal of each of the string selection transistors may be connected to a string selection line SSL. Moreover, each of the NAND cell strings 111, 112, 113, . . . , and 114 may be connected to a common source line CSL through each of ground selection transistors (e.g., GST). A gate terminal of each of the ground selection transistors may be connected to a ground selection line GSL.

The page buffer PB0 may be connected with the NAND cell string 111 through the bit line BL0. During a program operation, the page buffer PB0 may setup or precharge the bit line BL0. During a read operation, the page buffer PB0 may precharge the bit line BL0 and may sense whether the selected memory cell is turned on or off. Transistors for supplying a power supply voltage (VDD) to a bit line may be included in the page buffer PB0. Moreover, the page buffer PB0 may receive, from the control logic 150, a control signal S_CTRL for controlling the transistors.

In example embodiments, the control signal S_CTRL may be provided as control signals (e.g., BLSHF, BLSLT, and BLSETUP). The bit lines BL0 to BLn−1 may be precharged and developed based on the control signals.

The page buffers PB1 and PBn−1 may respectively precharge bit lines connected thereto based on the same procedure as the precharging operation of the above-described page buffer PB0.

Figure 3:
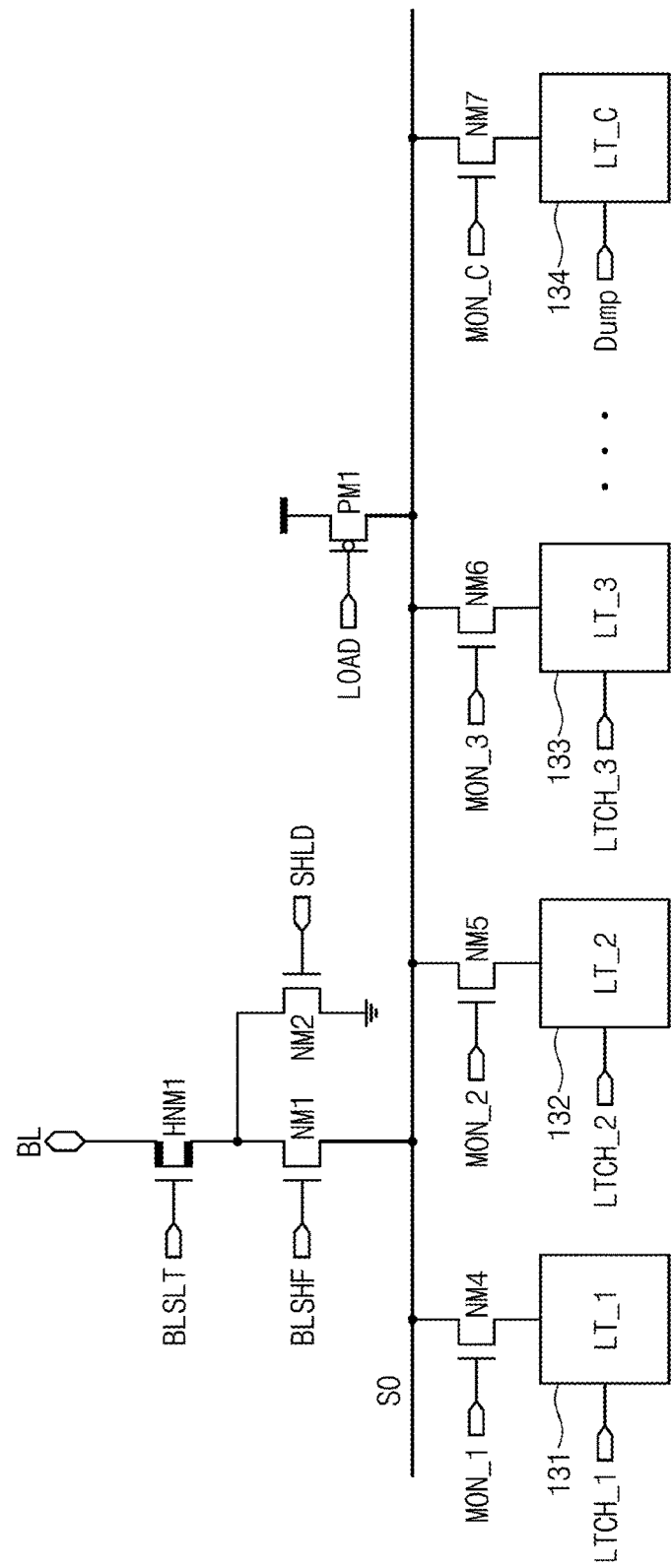
FIG. 3 is a block diagram illustrating a structure of a page buffer illustrated in FIG. 1 or 2.

FIG. 3 is a block diagram illustrating a structure of a page buffer illustrated in FIG. 1 or 2. Referring to FIG. 3, a page buffer connected to a bit line BL may be connected to memory cells of the NAND cell string 111 (refer to FIG. 2). The page buffer may include a sensing node SO connected to the bit line BL. Moreover, the page buffer may include a plurality of latches 131 to 134, each of which may be connected to the sensing node SO.

During a read operation, the bit line BL may be precharged by the control logic 150. For example, when a load signal LOAD and a control signal BLSHF are activated (e.g., activated by the control logic 150), the bit line BL may be precharged to a specific level (e.g., VBL). In this case, a high voltage transistor HNM1 may maintain a turn-on state based on a bit line selection signal BLSLT. The bit line selection signal BLSLT may be provided by the control logic 150.

Next, when the load signal LOAD is deactivated (e.g., deactivated by the control logic 150), a current due to a charge charged at the sensing node SO may flow into the bit line BL through a transistor NM1 which is turned on by the control signal BLSHF. When the selected memory cell is an on cell, a charge charged at the sensing node SO may be discharged to the common source line CSL through the bit line BL and the channel of a cell string. In this case, because a current flowing from the sensing node SO to the bit line BL is relatively great, the speed of a voltage drop of the sensing node SO may be relatively fast. On the other hand, when the selected memory cell is an off cell, it may be difficult for a charge charged at the sensing node SO to be discharged to the common source line CSL through the bit line BL. Accordingly, because a current flowing from the sensing node SO to the bit line BL is relatively small, the speed of a voltage drop of the sensing node SO may be relatively slow.

During an OCVS read operation, the page buffer according to example embodiments of inventive concepts may store a plurality of sensed results in the latches 131 to 134. For example, between a first program state (S1) and a second program state (S2), read voltages of different levels may be provided to the selected memory cell to perform a read the OCVS read operation. Moreover, information about whether a memory cell selected according to each read voltage is turned on or off may be sequentially stored in the latches 131 to 134. In the latches 131 to 134, latch control signals LTCH_1, LTCH_2, LTCH_3, . . . , and Dump for storing a developed state of the sensing node SO may be provided (e.g., provided from the control logic 150).

Next, the number of memory cells having a threshold voltage placed between read voltages of different levels may be counted using data stored in the latches 131 to 134. The cell counting operation may be performed the same as that of the above-described cell counter 170. For example, it is assumed that the sensed result based on a first read voltage is stored in a first latch LT_1 of each of the page buffers PB0 to PBn−1 and the sensed result based on a second read voltage is stored in a second latch LT_2 of each of the page buffers PB0 to PBn−1. When an exclusive-OR (XOR) operation about bits stored in the first latch LT_1 of each of the page buffers PB0 to PBn−1 and bits stored in the second latch LT_2 of each of the page buffers PB0 to PBn−1 is executed, the number of memory cells having a threshold voltage between a first read voltage and a second read voltage may be calculated. In addition, the calculation and comparison of the number of the memory cells may be executed using a current comparator having a differential amplifier form according to values of bits stored in each of the latches.

Although not illustrated, one latch (e.g., LT_1) may be controlled to sequentially only latch the state of the sensing node SO. Moreover, in the latches LT_2, LT_3, . . . , and LT_C, data may be controlled to be copied from the latch LT_1. Moreover, one latch (e.g., LT_C) may be used for outputting data of one latch, which is selected, from among latches.

Above, a structure of the page buffer for performing the OCVS read operation is described. A structure of each of the page buffer PB0 to PBn−1 may be the substantially same as the page buffer thus illustrated.

Figure 4:
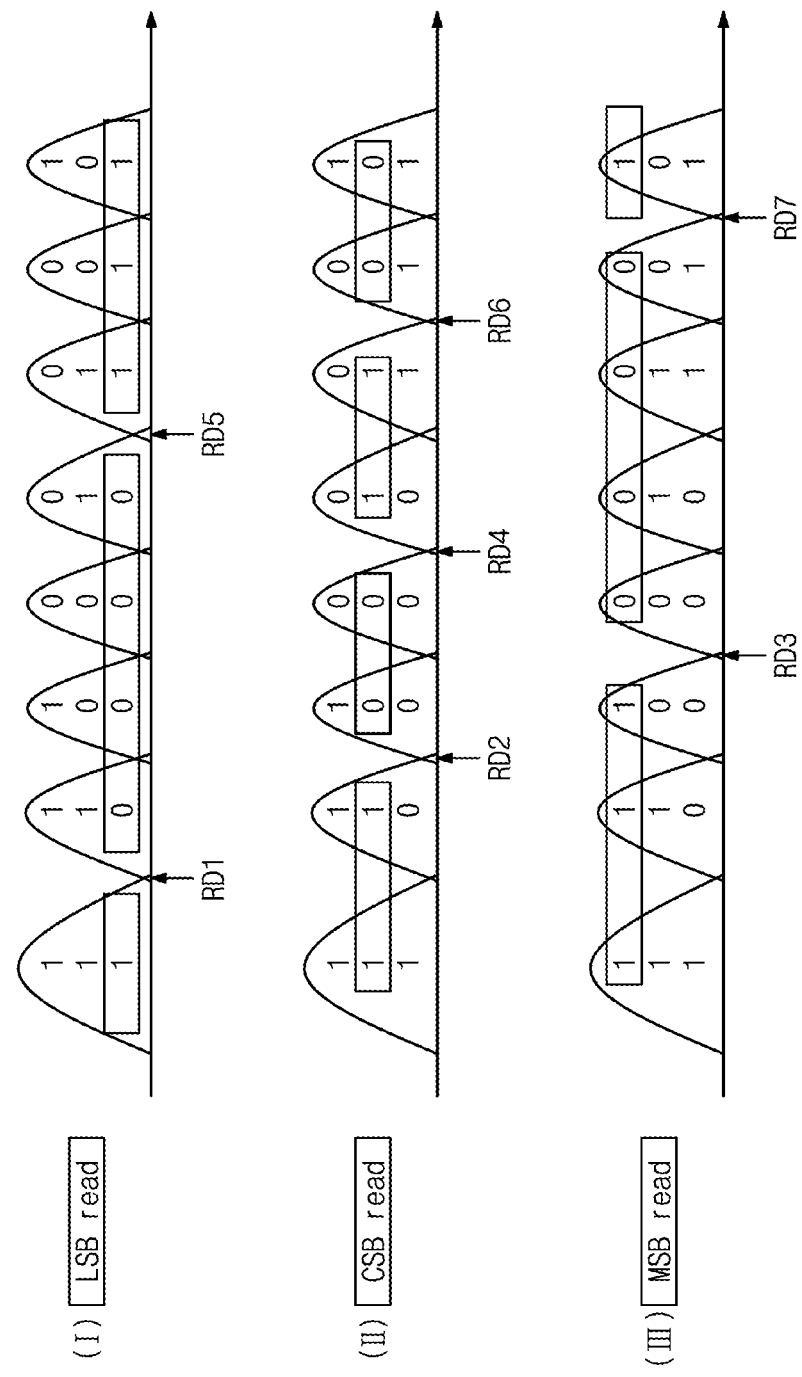
FIG. 4 is a diagram illustrating a conventional read method of a memory cell.

FIG. 4 is a diagram illustrating a conventional read method of a memory cell. Referring to FIG. 4, a read method may be disclosed by a page about a triple level cell (TLC) which stores data of 3 bits by a cell.

To read a least significant bit (LSB) page, a read voltage RD1 may be provided to a word line of selected memory cells. Moreover, whether the selected memory cells are turned on or off based on the read voltage RD1 may be sensed and information about whether the selected memory cells are turned on or off may be stored in one of a plurality of latches. Logical high may be latched according to the sensed result of a memory cell (e.g., on cell) having a threshold voltage lower than the read voltage RD1. Logical low may be latched according to the sensed result of a memory cell (e.g., off cell) having the threshold voltage equal to or higher than the read voltage RD1. Next, a read voltage RD5 may be provided to a word line of selected memory cells. Moreover, a memory cell sensed as an on cell based on the read voltage RD5 may maintain logical low which is previously latched. Moreover, a memory cell sensed as an off cell based on the read voltage RD5 may maintain logical high obtained by toggling logical low which is previously latched. After this processing is completed, a read result of the LSB page may be outputted.

To read a central significant bit (CSB) page, a read voltage RD2 may be provided to a word line of selected memory cells. Moreover, logical high may be latched in a page buffer corresponding to memory cells each of which is sensed as an on cell based on the read voltage RD2, and logical low may be latched in a page buffer corresponding to memory cells each of which is sensed as an off cell based on the read voltage RD2. Moreover, a page buffer corresponding to memory cells each of which is sensed as an on cell based on a read voltage RD4 may maintain a logical value which is previously sensed, and logical high may be latched in a page buffer corresponding to memory cells each of which is sensed as an off cell based on the read voltage RD4. Finally, a page buffer corresponding to memory cells each of which is sensed as an on cell based on a read voltage RD6 may maintain a logical value which is previously sensed, and logical low may be latched in a page buffer corresponding to memory cells each of which is sensed as an off cell based on the read voltage RD6.

To read a most significant bit (MSB) page, a read voltage RD3 may be provided to a word line of selected memory cells. Moreover, whether the selected memory cell are turned on or off based on the read voltage RD3 may be sensed and information about whether the selected memory cell are turned on or off may be stored in one of a plurality of latches. Logical high may be latched in a page buffer corresponding to memory cells each of which is sensed as an on cell based on the read voltage RD3, logical low may be latched in a page buffer corresponding to memory cells each of which is sensed as an off cell based on the read voltage RD3. Next, a read voltage RD7 may be provided to a word line of selected memory cells. Moreover, a logical value of a page buffer corresponding to memory cells each of which is sensed as an on cell based on the read voltage RD7 may be maintained with a logical value which is previously sensed. A page buffer corresponding to memory cells each of which is sensed as an off cell based on the read voltage RD7 may maintain logical high obtained by toggling logical low which is previously latched. After this processing is completed, a read result of the MSB page may be outputted.

Above, a conventional read operation of a triple level cell (TLC) is described as an example. During the conventional read operation, a read fail may occur due to the deterioration of a memory cell. The nonvolatile memory device 100 according to example embodiments of inventive concepts may perform the OCVS read operation for providing a high reliability based on an external request or an internal determination and may provide the result to an external device.

Figure 5:
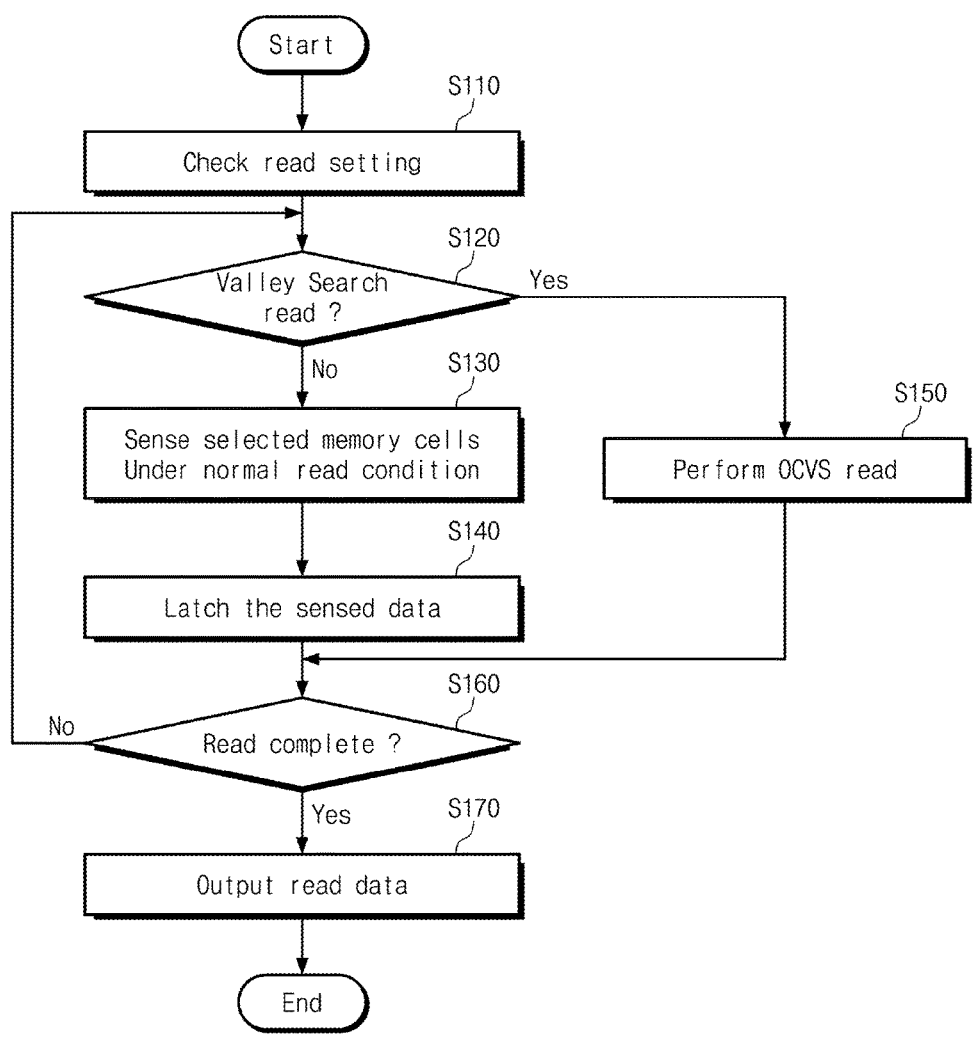
FIG. 5 is a flow chart illustrating a method of reading a nonvolatile memory device according to example embodiments of inventive concepts.

FIG. 5 is a flow chart illustrating a method of reading a nonvolatile memory device according to example embodiments of inventive concepts. Referring to FIG. 5, a nonvolatile memory device 100 may perform a read operation based on a read mode, which is set, from among a normal read mode and an OCVS read mode. When a read command is provided, a read operation according to example embodiments of inventive concepts may start.

In operation S110, the nonvolatile memory device 100 may recognize an overall setting value associated with a read operation thus requested. For example, the control logic 150 may check whether a read-requested page is an MSB page, a CSB page, or an LSB page. Alternatively, the control logic 150 may check the application order of a read voltage for reading the selected page. Moreover, the control logic 150 may check whether the mode of a current read operation is the normal read mode or the OCVS read mode. In the normal read mode, a read voltage may be only provided once to determine one data state about a memory cell. On the other hand, in the OCVS read mode, to determine one data state, read voltages of different levels may be provided a plurality of times, and a comparing operation about the sensed result may be performed.

In operation S120, an operating branch according to the set operating mode may occur. If a mode about the read operation is not the OCVS read mode (e.g., no direction), the procedure may proceed to operation S130. On the other hand, if a mode about the read operation is the OCVS read mode (e.g., yes direction), the procedure may proceed to operation S150.

In operation S130, to determine one data state about a memory cell, the control logic 150 may control the voltage generator 160 and the page buffer 130 to perform a normal read operation in which a read voltage is provided once. That is, after the read voltage is provided to a word line of the selected memory cells, the page buffer 130 may sense whether the selected memory cells are turned on or off. In operation S140, the sensed data may be latched in a latch of the page buffer 130.

In operation S150, to determine one data state about a memory cell, the control logic 150 may control the voltage generator 160 and the page buffer 130 to perform the OCVS read operation in which a read voltage is provided a plurality of times. In the OCVS read mode, to determine one data state about the selected memory cells, a plurality of read voltages of different levels may be provided. Alternatively, the same read voltage may be performed to determine one data state of the selected memory cells, but the OCVS read operation may be performed in the manner to latch the level of the sensing node SO at different develop times.

In operation S160, the control logic 150 may determine whether a read operation is completed. When the read operation about the selected page or memory cells is determined as being completed, the procedure may proceed to operation S170. However, when an additional read operation about the selected memory cells is required, the procedure may return to operation S120.

In operation S170, the data sensed in the normal operating mode or the OCVS read mode may be outputted to an external device.

Above, a method of performing a read operation in a selective read mode according to example embodiments of inventive concepts is described. In the OCVS mode, to determine the selected state, the control logic 150 may perform a sensing operation a plurality of times, may compare the sensed results, and may output an optimal read result.

Figure 6:
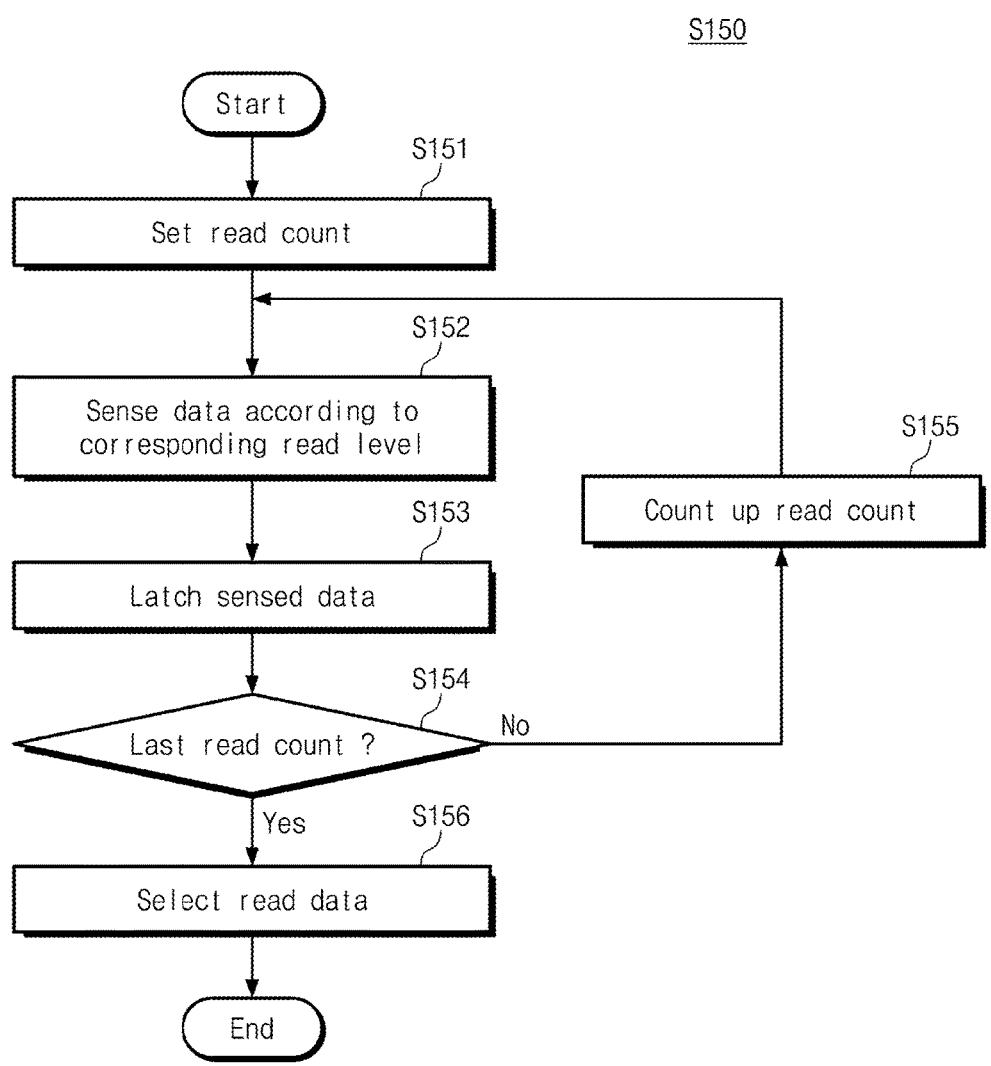
FIG. 6 is a flow chart for describing an OCVS read operation according to example embodiments of inventive concepts.

FIG. 6 is a flow chart for describing an OCVS read operation according to example embodiments of inventive concepts. Referring to FIG. 6, an OCVS read operation illustrated in operation S150 of FIG. 5 is illustrated.

In operation S151, a read count may be set. The read count may mean the number of search read operations about selected memory cells. For example, when the selected memory cells are a TLC, the read count may mean the number of read operations for distinguishing a program state (P1) from an erase state (E0) for reading a LSB page. That is, in a threshold voltage interval between the erase state (E0) and the program state (P1), the read count may mean the number of times that read voltages of different levels are applied thereto. Alternatively, the same read voltage may be provided to the selected memory cells, but the read count may mean the number of data latching operations performed in a develop period of the sensing node. Here, the read count may be provided as 3 or more or may be set to 2.

In operation S152, the memory cells selected according to the level of a read voltage corresponding to the corresponding read count may be sensed. Alternatively, information about whether the selected memory cells are turned on or off in the develop time corresponding to the read count may be stored in a sensing latch of the page buffer 130.

In operation S153, the sensed data may be stored in a latch for storing data. Here, an operation to sense data and to latch the sensed data may be regarded as one process, because there is a separate sensing latch for sensing the develop state of the sensing node SO but each of a plurality of latches performs a sensing latch function and performs a data storing function.

In operation S154, whether the read count is a set final read count may be determined. The final read count may be a value which is set in operation S151. If the read count of a read operation which is currently performed is not the final read count, the procedure may proceed to operation S155. On the other hand, if the read count of a read operation which is currently performed is the final read count, the procedure may proceed to operation S156.

In operation S155, the read count may be counted up. Moreover, the procedure may proceed to operation S152 for a sensing and latching operation corresponding to the counted-up read count.

In operation S156, an operation to select one read result among a plurality of read results thus latched may be performed. That is, latch values corresponding to an optimal read result may be selected by comparing the read results near a valley. A method of selecting the optimal read data among read data stored in the latches will be described in detail with reference to accompanying drawings.

Figure 7:
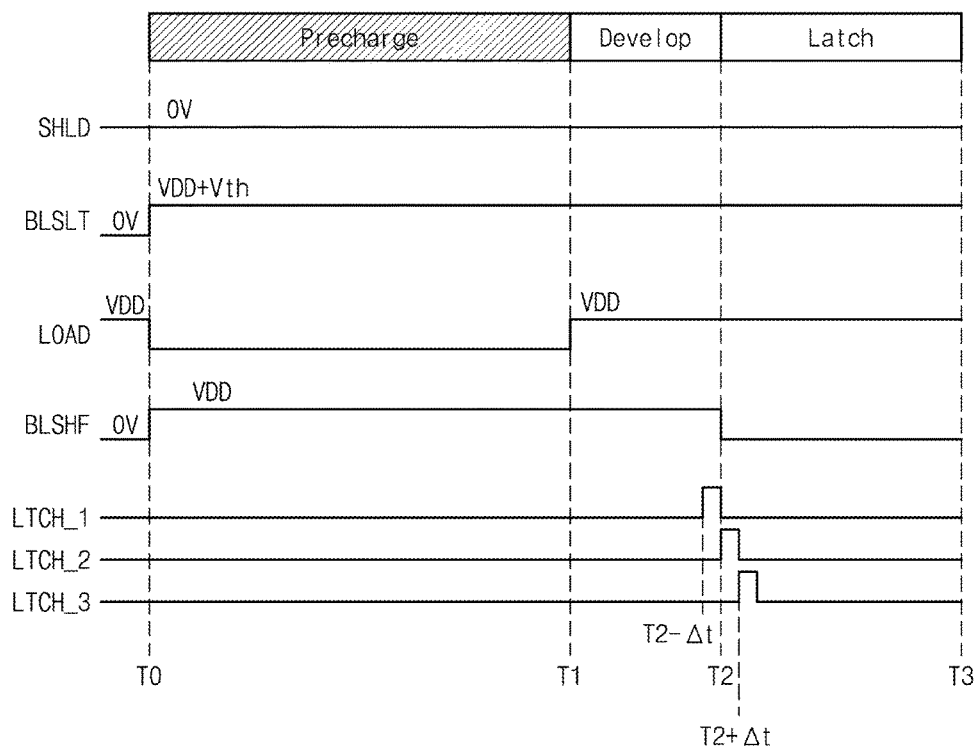
FIG. 7 is a timing diagram for describing an OCVS read operation according to example embodiments of inventive concepts.

FIG. 7 is a timing diagram for describing an OCVS read operation according to example embodiments of inventive concepts. Referring to FIGS. 3 and 7, an OCVS read operation may be performed according to a method of latching a sensing node and storing a sensed result of a plurality of times during different develop periods.

From time T0 to time T1, a precharge operation may be performed. The bit lines BL0 to BLn−1 and sensing nodes SOs respectively connected to the page buffers PB0 to PBn−1 may be charged to perform the precharge operation. For example, when the control signals BLSHF and BLSLT and the load signal LOAD are activated, each of the sensing node SO and the bit line BL may be precharged to a specific level.

At time T1, when the load signal LOAD is deactivated with a high level, the PMOS transistor PM1 may be turned off, and thus a current supply from a power supply voltage to the sensing node SO may be interrupted. In the case, the level of the sensing node SO may be changed according to the magnitude of a current flowing into the bit line BL based on whether a memory cell is turned on or off. When the selected memory cell is an on cell, a current flowing into a bit line may be relatively great. Accordingly, the level of the sensing node SO may be relatively speedily lowered. On the other hand, when the selected memory cell is an off cell, the level of the sensing node SO may be maintained at a nearly constant level.

However, memory cells of threshold voltages distributed around a valley may be memory cells placed at a boundary between an on cell and an off cell. Accordingly, a distinction between an on cell and an off cell about the memory cells may be changed according to the develop time. That is, even though the develop time slightly decreases, each of the memory cells of threshold voltages distributed around a valley may be determined as an off cell. On the other hand, even though the develop time slightly increases, each of the memory cells of threshold voltages distributed around a valley may be determined as an on cell. That is, in memory cells having a threshold voltage level similar to a read voltage level to be provided to a word line, a sensing operation may be performed the same as a sensing operation using a read voltage increased, by reducing a develop time. On the other hand, in memory cells having a threshold voltage level similar to a read voltage level to be provided to a word line, a sensing operation may be performed the same as a sensing operation using a read voltage decreased, by increasing a develop time.

Accordingly, sensing the sensing node SO a plurality of times at a point in time when a develop time is changed may be the same as changing a word line voltage and precharging and sensing a bit line.

A pulse of the control signal LTCH_1 may be activated at a point in time earlier than time T2 by Δt (e.g., T2−Δt). That is, the pulse of the control signal LTCH_1 for latching a logical value corresponding to the state of the sensing node SO in the first latch LT_1 of each of the page buffers PB0 to PBn−1 may be provided under the condition of the same read voltage. Moreover, at time T2, the pulse of a control signal LTCH_2 for latching the state of the sensing node SO in the second latch LT_2 of each of the page buffers PB0 to PBn−1 may be provided. Moreover, the pulse of a control signal LTCH_3 for latching the state of the sensing node SO in the third latch LT_3 of each of the page buffers PB0 to PBn−1 may be provided at a point in time later than time T2 by Δt (e.g., T2+Δt). To increase a read resolution, a time difference Δt may be further reduced, and a sensing and latching operation may be further performed a plurality of times.

Figure 8:
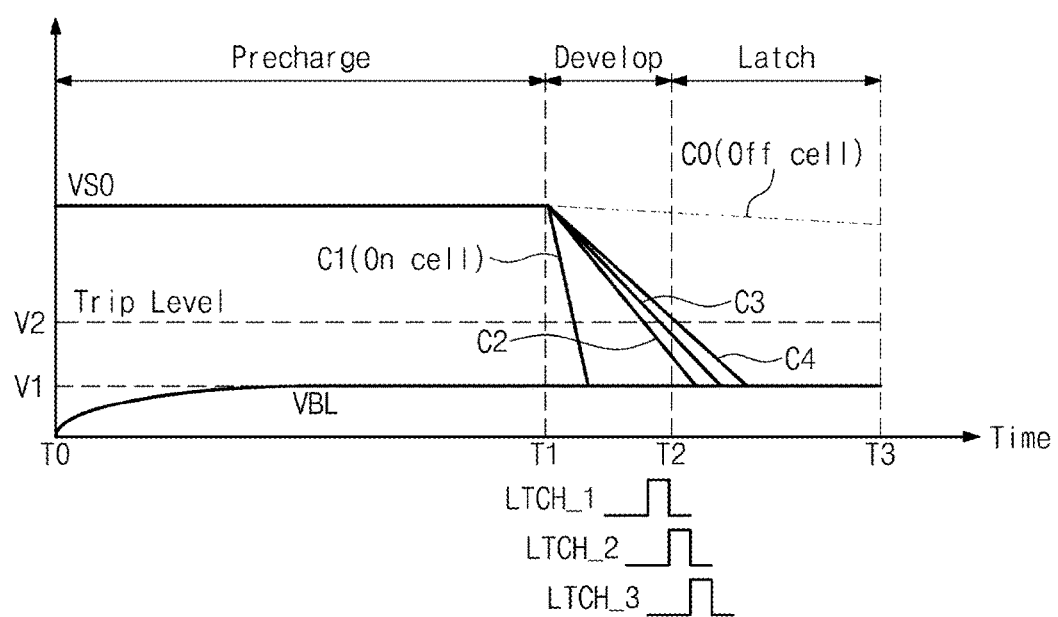
FIG. 8 is waveform diagram illustrating a level change of a sensing node based on control signals illustrated in FIG. 7.

FIG. 8 is waveform diagram illustrating a level change of a sensing node SO based on control signals illustrated in FIG. 7. Referring to FIG. 8, the level change of the sensing node SO according to a threshold voltage level of a memory cell and a latch result according to a develop period may be briefly illustrated. An interval from time T0 to time T1 may be referred to as "precharge period", an interval from time T1 to time T2 may be referred to as "develop period", and an interval after time T2 may be referred to as "latch period". As described in FIG. 7, during the develop period, the load signal LOAD may be deactivated, and during the latch period, the control signal BLSHF may be deactivated.

During the precharge period, both the load signal LOAD and the control signal BLSHF may be activated, and a bit line and a sensing node may be precharged. During the precharge period, a bit line voltage VBL may be charged to a first voltage level V1. During the precharge period, the sensing node SO may be charged to a sensing node voltage VSO.

At time T1, when the develop period starts, the load signal LOAD may be deactivated. During this interval, the control signal BLSHF may be still maintained at an activated state. Accordingly, a charge charged at the sensing node SO may move to the bit line BL based on the threshold voltage state of a memory cell.

In the case of a strong off cell of which a threshold voltage is relatively higher than a read voltage, the level change of the sensing node SO may be relatively small. During the develop period, the change of a voltage level of the sensing node SO about a strong off cell may correspond to a curve C0 corresponding to dotted line. In the case of a strong on cell of which a threshold voltage is relatively lower than a read voltage, the level change of the sensing node SO may be relatively great. During the develop period, the change of a voltage level of the sensing node SO about the strong on cell may correspond to a curve C1. The strong off cell or a strong on cell may not be significantly affected by the slight change of the develop time.

The voltage change of the sensing node SO for sensing memory cells may correspond to curves C2, C3, and C4, and a threshold voltage of each of the memory cells may be placed near a read voltage. The curve C2 illustrates a develop slope of a memory cell having a threshold voltage slightly lower than the read voltage. The curve C3 illustrates a develop slope of a memory cell having a threshold voltage nearly similar to the read voltage. The curve C4 illustrates a develop slope of a memory cell having a threshold voltage slightly higher than the read voltage.

The first latch signal LTCH_1 for latching the sensing node SO of a memory cell may be provided at a latching time earlier than time T2. When states of the sensing nodes are latched in response to the first latch signal LTCH_1, a logical value corresponding to an off cell may be latched in the case of a strong off cell, and a logical value corresponding to an on cell may be latched in the case of a strong on cell. However, a logical value corresponding to an on cell may be latched in the case of memory cells corresponding to the curve C2 each of which has a threshold voltage being relatively low. On the other hand, in the case of memory cells corresponding to the curves C3 and C4, a logical value corresponding to an off cell may be latched in response to the first latch signal LTCH_1.

When the sensing nodes are latched in response to the second latch signal LTCH_2, logical low may be latched in the case of a strong off cell (corresponding to C0), and logical high may be latched in the case of a strong on cell (corresponding to C1), as in the first latch signal LTCH_1. However, in the case of memory cells having a threshold voltage corresponding to the curve C2, a logical value corresponding to an on cell may be latched. On the other hand, in the case of memory cells corresponding to the curve C3, a voltage level of the sensing node SO of a trip level V2 may be latched in response to the second latch signal LTCH_2. That is, logical low and logical high may not be distinguished. In the case of memory cells corresponding to the curve C4, a logical value corresponding to an off cell may be latched in response to the second latch signal LTCH_2.

When the sensing nodes are latched in response to the third latch signal LTCH_3, logical low may be latched in the case of a strong off cell (corresponding to C0), and logical high may be latched in the case of a strong on cell (corresponding to C1), as in the first latch signal LTCH_1. However, in the case of memory cells having a threshold voltage corresponding to the curves C2 and C3, logical high corresponding to an on cell may be latched. Moreover, in the case of memory cells corresponding to the curve C4, logical low corresponding to an off cell may be latched in response to the third latch signal LTCH_3.

Above, to determine one data state, a method of latching the state of the sensing node SO as a logical value at different develop periods is described. This may be similar to substantially providing read voltages of different levels to a word line based on the develop period. The OCVS read operation performed with respect to one above-described data state may be selectively applied to each of read voltages or according to a read voltage.

Figure 9:
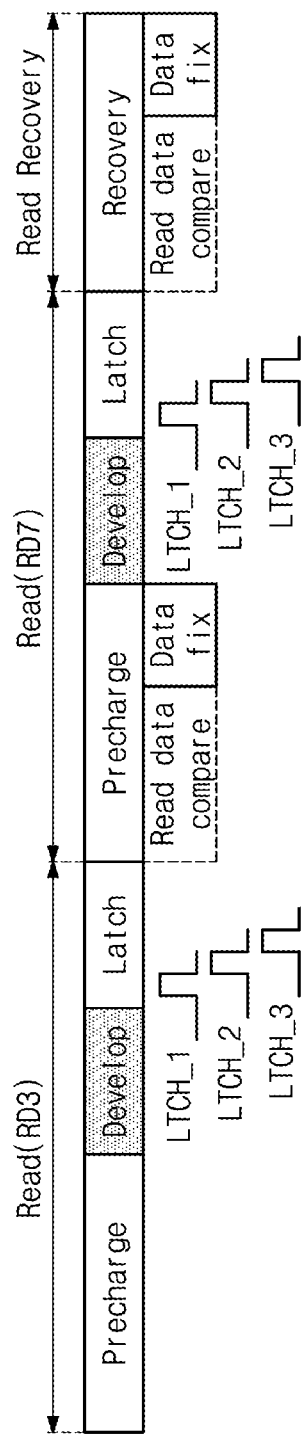
FIG. 9 is a block diagram for describing applying an OCVS read operation according to example embodiments of inventive concepts to an MSB page of a TLC.

FIG. 9 is a block diagram for describing applying an OCVS read operation according to example embodiments of inventive concepts to an MSB page of a TLC. Referring to FIG. 9, to read the MSB page of a TLC in an OCVS manner, a read operation based on the read voltage RD3 and a read operation based on the read voltage RD7 may be performed. Afterwards, a read recovery for initializing a page buffer and a word line voltage may be performed.

To perform the OCVS read operation based on the read voltage RD3, a bit line and the sensing node SO may be precharged. The read voltage RD3 may be provided to a word line of selected memory cells. When the precharge operation is completed, a develop operation for generating the voltage change of the sensing node SO according to the state of a memory cell may be performed in the page buffers PB0 to PBn-1 (refer to FIG. 2). Moreover, the states of memory cells selected at different develop times may be latched in response to latch signals LTCH_1, LTCH_2, and LTCH_3 sequentially provided. In the case, the latched data may be stored in a plurality of latches included in each of the page buffers PB0 to PBn-1.

To perform the OCVS read operation based on the read voltage RD7, a bit line and the sensing node SO may be precharged. The read voltage RD7 may be provided to a word line of selected memory cells. When the precharge operation is completed, a develop operation for generating the voltage change of the sensing node SO according to the state of a memory cell may be performed in the page buffers PB0 to PBn-1. Moreover, the data states of memory cells selected at different develop periods may be latched in response to the latch signals LTCH_1, LTCH_2, and LTCH_3, and the latched data may be stored in a plurality of latches included in each of the page buffers PB0 to PBn-1.

In particular, a comparing and selecting operation about data latched in latches of each of the page buffers PB0 to PBn-1 may be performed during a precharge period of a read operation based on the read voltage RD7. That is, memory cells may be counted by comparing data latched in response to the first latch signal LTCH_1 and data latched in response to the second latch signal LTCH_2. That is, memory cells may be counted by comparing data latched in response to the second latch signal LTCH_2 and data latched in response to the third latch signal LTCH_3. One of data sets latched in response to each of the latch signals LTCH_1, LTCH_2, and LTCH_3 may be selected by comparing the numbers about the counted memory cells. In FIG. 9, this process is illustrated as a data fix. When one data set is selected, the remaining two data sets may be reset. Accordingly, latch sets in which the remaining two data sets store may store a state value of the sensing node SO during the develop period and the latch period after the latch sets are reset.

When the OCVS read operation based on the read voltage RD7 is completed, data comparing and selecting operation and a read recovery may be performed in a pipeline manner. During a read recovery period, the bit lines BL0 to BLn-1 and sensing nodes SOs may be returned to an initial voltage level. In this case, one of data sets latched in response to each of the latch signals LTCH_1, LTCH_2, and LTCH_3 may be selected through a comparing operation under the condition of the read voltage RD7. Moreover, an MSB data may be determined by processing the OCVS result based on the read voltage RD3 and the OCVS result based on the read voltage RD7.

Figure 10A:
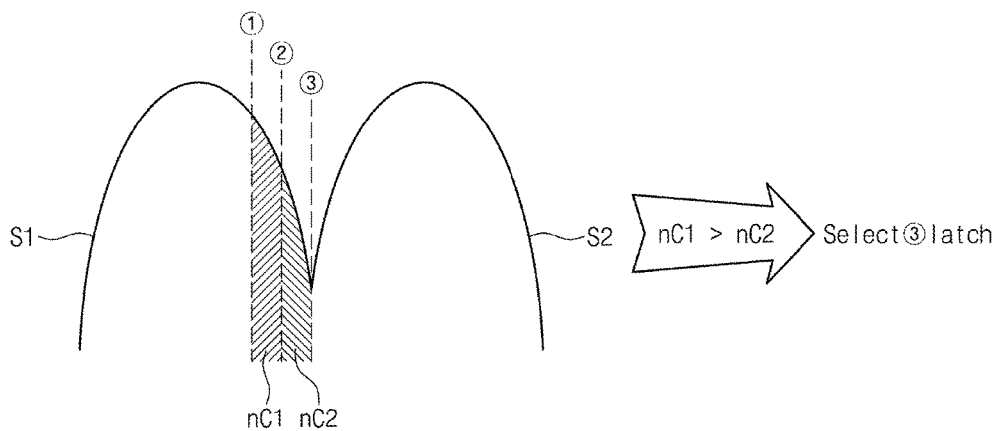
FIGS. 10A to 10C are schematic diagrams for describing a method of selecting data using a latch result of a sensing node of three times, respectively.
Figure 10B:
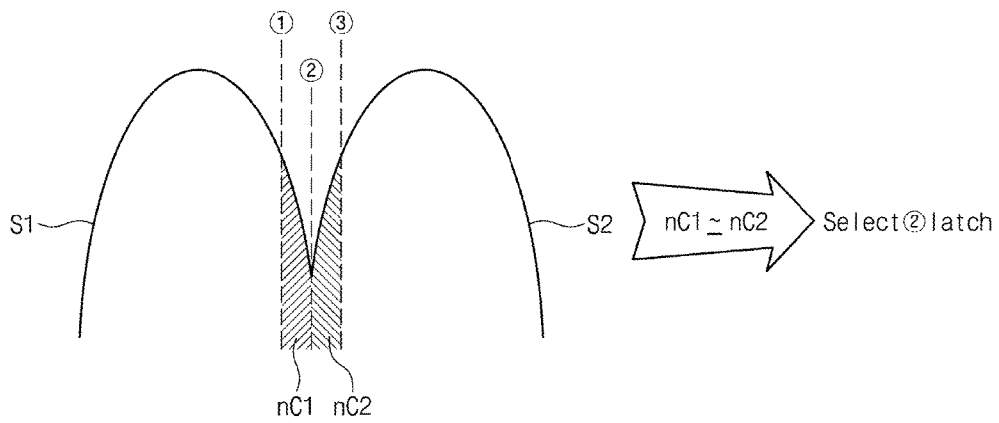
Figure 10C:
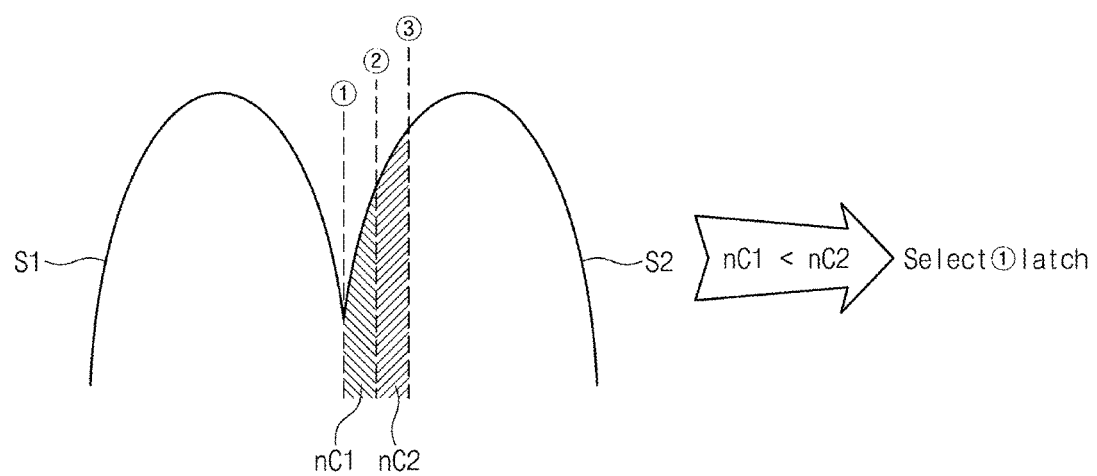

FIGS. 10A to 10C are schematic diagrams for describing a method of selecting data using a latch result of a sensing node SO of three times, respectively. FIG. 10A illustrates a data selection method when threshold voltages of memory cells each of which is sensed through an OCVS read operation are placed at the left of a valley. FIG. 10B illustrates a data selection method when threshold voltages of the sensed memory cells are placed at the center of a valley. FIG. 10C illustrates a data selection method when threshold voltages of the memory cells each of which is sensed through an OCVS read operation are placed at the right of a valley.

Referring to FIG. 10A, a threshold voltage level stored in latch sets may be modeled according to the OCVS read operation for distinguishing two states S1 and S2 of a memory cell. That is, a distribution diagram in which a threshold voltage positions of memory cells are illustrated may be illustrated when the memory cells are sensed at different develop periods or when the memory cells are sensed using read voltages of different levels. For example, when latched with a logical level in response to the first latch signal LTCH_1 under the same read voltage condition, the state of the sensing node SO may be matched as a result sensed and latched using a read voltage of ① level. When latched with a logical level in response to the second latch signal LTCH_2 under the same read voltage condition, the state of the sensing node SO may be matched as the sensed and latched result using a read voltage of ② level. Moreover, when latched with a logical level in response to the third latch signal LTCH_3 under the same read voltage condition, the state of the sensing node SO may be matched as the sensed and latched result using a read voltage of ③ level. A latched result corresponding to ① level may be referred to as "first latch set". That is, the first latch set may denote a latch set, which stores data latched in response to the first latch signal LTCH_1, from among a plurality of latch sets. That is, the second latch set may denote a latch set, which stores data latched in response to the second latch signal LTCH_2, from among a plurality of latch sets. That is, the third latch set may denote a latch set, which stores data latched in response to the third latch signal LTCH_3, from among a plurality of latch sets.

Under this assumption, memory cells of threshold voltages placed between ① level and ② level may be counted when the first latch set and the second latch set are compared. For example, when an XOR operation is executed with respect to data latched in each of the first latch set and the second latch set, the number nC1 of memory cells of threshold voltages is placed between ① level and ② level may be counted. Likewise, the number nC2 of memory cells of which threshold voltages are placed between ② level and ③ level may be counted. The count operation may be performed at the cell counter 170 illustrated in FIG. 1.

When the numbers nC1 and nC2 about memory cells are counted, the numbers about the counted memory cells may be compared. When the number nC1 of memory cells is determined as being greater than the number nC2 of memory cells, the control logic 150 may select a latch set corresponding to ③ level. That is, a read result corresponding to a valley may be determined as data stored in the third latch set.

Referring to FIG. 10B, the case that the OCVS read operation is performed based on a valley compared with FIG. 10A will be described. Memory cells of which threshold voltages are placed between ① level and ② level may be counted by comparing the first latch set and the second latch set. The number nC1 of memory cells of which threshold voltages are placed between ① level and ② level may be counted through the comparison of the first latch set and the second latch set of a page buffer. Likewise, the number nC2 of memory cells of which threshold voltages are placed between ②level and ③level may be counted.

When each of the numbers nC1 and nC2 about memory cells are counted, the numbers about the counted memory cells may be compared. When the number nC1 of memory cells is determined as being equal to or greater than the number nC2 of memory cells, the control logic 150 may select a latch set corresponding to ②level. That is, a read result corresponding to a valley may be determined as data stored in the second latch set.

Referring to FIG. 10C, the case that the OCVS read operation is performed when a threshold voltage is placed at the right of a valley compared with FIG. 10B will be described. Memory cells of which threshold voltages are placed between ①level and ②level may be counted by comparing the first latch set and the second latch set. The number nC1 of memory cells of which threshold voltages are placed between ①level and ②level may be counted through the comparison of the first latch set and the second latch set of a page buffer. Likewise, the number nC2 of memory cells of which threshold voltages are placed between ②level and ③level may be counted.

When each of the numbers nC1 and nC2 about memory cells are counted, the numbers about the counted memory cells may be compared. When the number nC2 of memory cells is greater than the number nC1 of memory cells, the control logic 150 may select a latch set corresponding to ①level. That is, a read result corresponding to a valley may be determined as data stored in the first latch set.

FIGS. 11A to 11D are schematic diagrams for describing a method of selecting data using a latch result of a sensing node SO of twice, respectively.

Figure 11A:
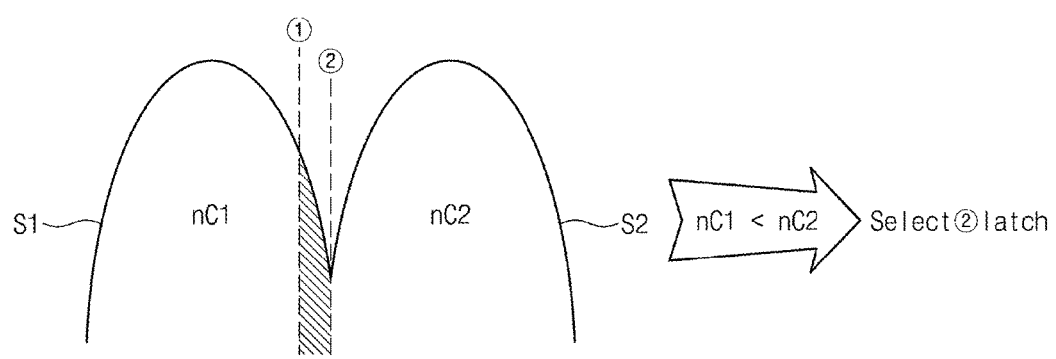
FIGS. 11A to 11D are schematic diagrams for describing a method of selecting data using a latch result of a sensing node of twice, respectively.

Referring to FIG. 11A, when latched with a logical level in response to the first latch signal LTCH_1 under the same read voltage condition, the state of the sensing node SO may be matched as a result sensed and latched using a read voltage of ①level. When latched with a logical level in response to the second latch signal LTCH_2 under the same read voltage condition, the state of the sensing node SO may be matched as the sensed and latched result using a read voltage of ②level. A latched result corresponding to ①level may be referred to as "first latch set". That is, the first latch set may denote a latch set, which stores data latched in response to the first latch signal LTCH_1, from among a plurality of latch sets. Moreover, the second latch set may denote a latch set, which stores data latched in response to the second latch signal LTCH_2, from among a plurality of latch sets.

Moreover, it is assumed that the number of memory cells included in each of the two states S1 and S2 is identical. Under the assumption, memory cells, each of which has a threshold voltage lower than ①level, from among memory cells corresponding to the state S1 may be counted using the first latch set. Moreover, memory cells, each of which has a threshold voltage higher than ②level, from among memory cells corresponding to the state S2 may be counted using the second latch set.

When the numbers nC1 and nC2 about memory cells are counted, the numbers about the counted memory cells may be compared. When the number nC1 of memory cells is determined as being smaller than the number nC2 of memory cells, the control logic 150 may select a latch set corresponding to ②level. That is, a read result corresponding to a valley may be determined as data stored in the second latch set.

Figure 11B:
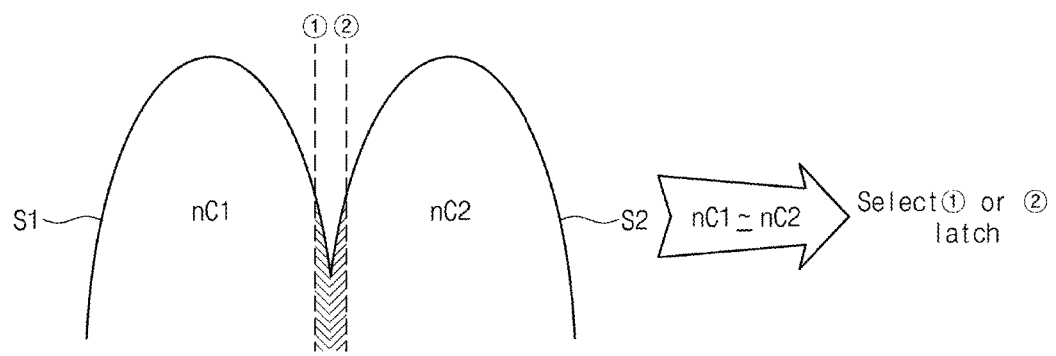

Referring to FIG. 11B, the case that the OCVS read operation is performed based on a valley compared with FIG. 11A will be described. When the numbers nC1 and nC2 about memory cells are counted, the numbers about the counted memory cells may be compared. When the number nC1 of memory cells is determined as being the same as or similar to the number nC2 of memory cells, the control logic 150 may randomly select one of the first latch set and the second latch set and may output the selected one.

Figure 11C:
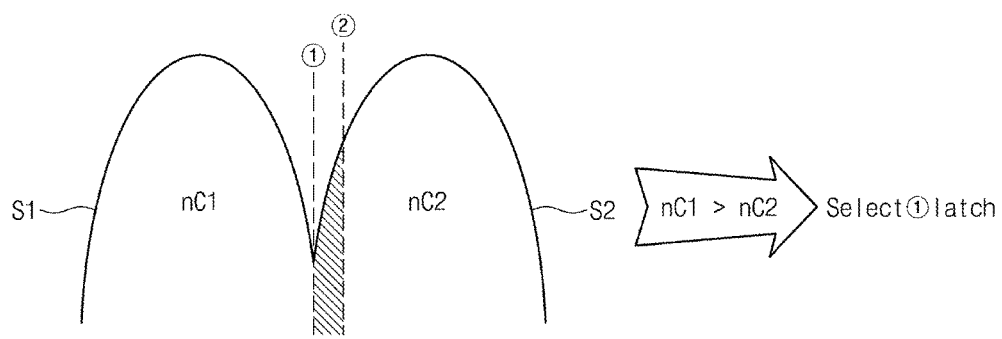

Referring to FIG. 11C, the case that the OCVS read operation is performed when a threshold voltage is placed at the right of a valley compared with FIG. 11B will be described. Memory cells of which threshold voltages are placed between ①level and ②level may be counted by comparing the first latch set and the second latch set. The numbers nC1 and nC2 about memory cells may be counted by processing data of each of the first and second latch sets of the page buffer 130.

When each of the numbers nC1 and nC2 about memory cells are counted, the numbers about the counted memory cells may be compared. When the number nC2 of memory cells is greater than the number nC1 of memory cells, the control logic 150 may select a latch set corresponding to ①level. That is, a read result corresponding to a valley may be determined as data stored in the first latch set.

In each of the above-described states S1 and S2, FIGS. 11A to 11C illustrates a method of counting memory cells of threshold voltages each of which is smaller than or equal to a specific level or each of which is greater than or equal to a specific level. That is, a method of counting the number of memory cells having a specific state which is a target of the OCVS at a MLC or a TLC is illustrated.

Figure 11D:
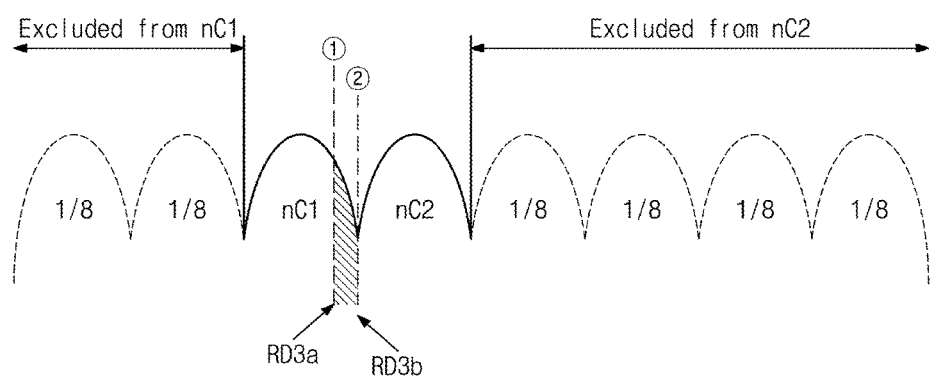

As shown in FIG. 11D, read voltage RD3*a* may correspond to the read voltage of ①level in FIG. 11A and read voltage RD3*b* may correspond to the read voltage of ②level in FIG. 11A. The number nC1 of memory cells may be calculated by subtracting the number (e.g., $\frac{2}{8}$) of memory cells allocated at two states from a read result (e.g., the number of on cells) based on ①level. Moreover, the number nC2 of memory cells may be calculated by subtracting the number (e.g., $\frac{4}{8}$) of memory cells allocated at fourth states from a read result (e.g., the number of off cells) based on ②level.

Figure 12:
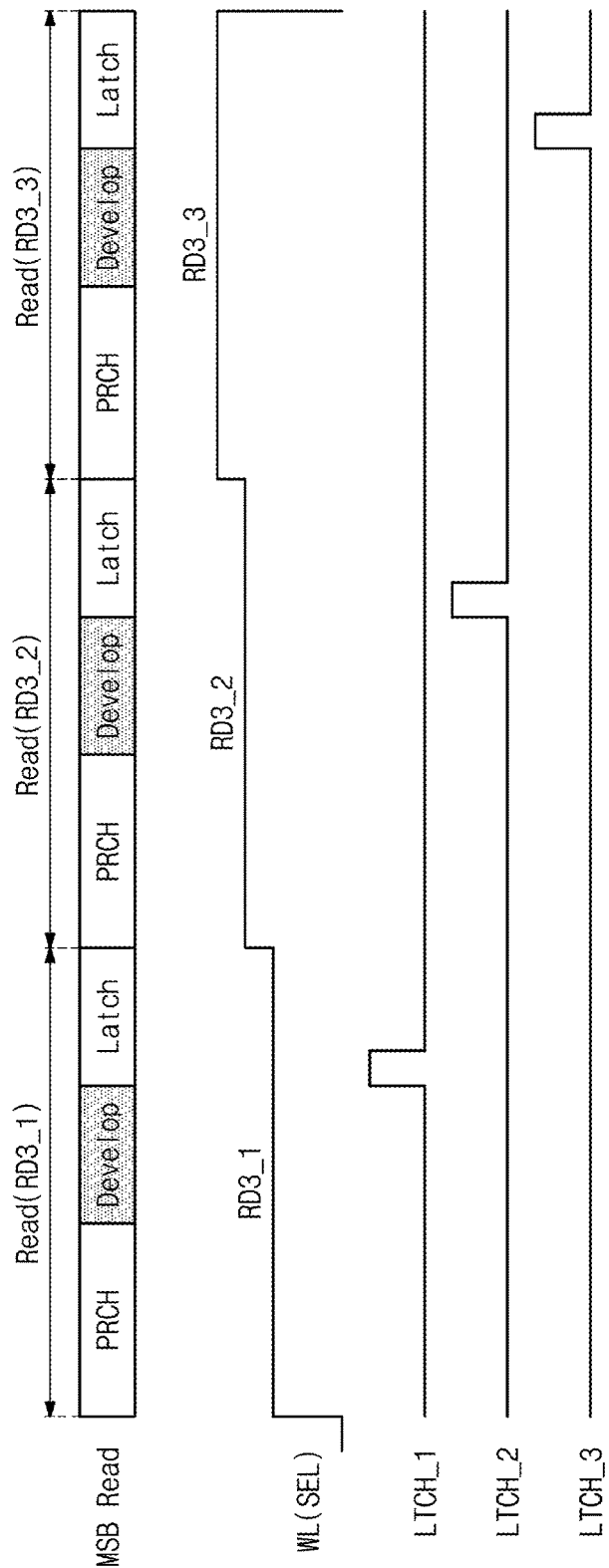
FIG. 12 is a timing diagram for describing an OCVS read operation according to example embodiments of inventive concepts.

FIG. 12 is a timing diagram for describing an OCVS read operation according to example embodiments of inventive concepts. Referring to FIG. 12, to perform an OCVS read operation, a method of directly changing a read voltage provided to a word line may be applied not a method of controlling a develop period. A case where the OCVS read operation is applied in a read operation of an MSB page of a TLC may be provided as an example.

To perform an OCVS read operation about the MSB page, a read voltage RD3_1 may be applied to a word line of selected memory cells. Moreover, when a precharge and develop operation about a bit line and a sensing node is completed by the page buffers PB0 to PBn−1, the first latch signal LTCH_1 may be activated in the form of a pulse. In this time, the result of the OCVS read operation corresponding to the read voltage RD3_1 may be stored in a first latch set.

Next, a read voltage RD3_2 may be applied to a word line of selected memory cells. The read voltage RD3_2 may be higher than the read voltage RD3_1 but may be a voltage for determining the same data state. When a precharge and develop operation about a bit line and a sensing node is completed by the page buffers PB0 to PBn−1, the second latch signal LTCH_2 may be activated in the form of a pulse.

In this time, the result of the OCVS read operation corresponding to the read voltage RD3_2 may be stored in a second latch set of the page buffers PB0 to PBn−1.

Moreover, a read voltage RD3_3 may be applied to a word line of selected memory cells. The read voltage RD3_3 may be higher than the read voltage RD3_2 but may be a voltage for determining the data same state as in the read voltage RD3_1 or the read voltage RD3_2. When a precharge and develop operation about a bit line and a sensing node is completed by the page buffers PB0 to PBn−1, the third latch signal LTCH_3 may be activated in the form of a pulse. In this time, the result of the OCVS read operation corresponding to the read voltage RD3_3 may be stored in a third latch set of the page buffers PB0 to PBn−1.

Afterwards, when results stored in the first to third latch sets are compared, one latch set may be selected. This comparison may be performed in an above-described manner described with reference to FIGS. 10A to 10C and 11A to 11D.

Figure 13:
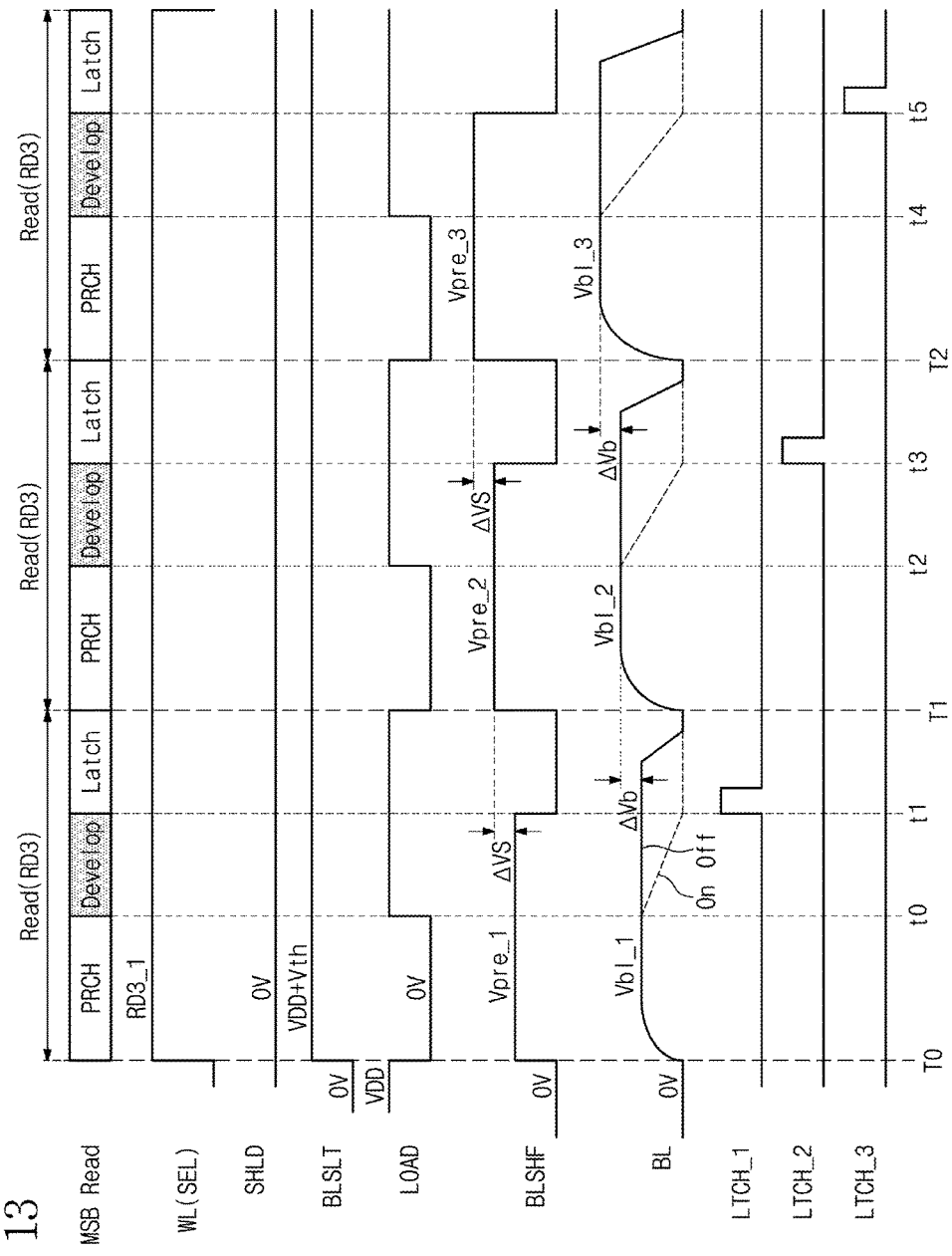
FIG. 13 is a timing diagram for describing an OCVS read operation, according to another embodiment of the inventive concept.

FIG. 13 is a timing diagram for describing an OCVS read operation, according to another embodiment of the inventive concept. Referring to FIG. 13, a method of changing a level of a bit line BL (refer to FIG. 3) may be applied not a method of controlling a develop period to perform the OCVS read operation. As an example of changing the level of the bit line BL, it is described that the OCVS read operation is applied during a read operation on the MSB page of a TLC.

At time T0, a first OCVS read operation may start. To perform the first OCVS read operation on the MSB page, a read voltage RD3_1 may be applied to word lines of selected memory cells. Furthermore, the bit line BL may be precharged with a first bit line voltage Vbl_1 by the control logic 150. For example, a load signal LOAD may be activated with 0 V, and a control signal BLSHF may be provided with a first precharge control voltage Vpre_1. Then, the bit line BL may be precharged with the first bit line voltage Vbl_1. In this case, a high voltage transistor HNM1 may maintain a turn-on state based on a bit line selection signal BLSLT. That is, when a level of the control signal BLSHF is changed, an amount of charge charged at the bit line BL through a transistor NM1 may be controlled.

Next, at time t0, a develop operation of the first OCVS read operation may be performed. When the load signal LOAD is deactivated with a high level, the charge charged at a sensing node SO and the bit line BL may be discharged according to a program state of a memory cell. When the selected memory cell is an on cell, the charge charged at the sensing node SO and the bit line BL may be discharged to a common source line CSL. Voltage fluctuations of the bit line BL connected to the on cell are illustrated with a dotted line. On the other hand, when the selected memory cell is an off cell, it is difficult for the charge charged at the sensing node SO and the bit line BL to be discharged to the common source line CSL. Accordingly, since a current flowing from the sensing node SO to the bit line BL is relatively small, the speed of a voltage drop of the sensing node SO may be relatively slow. Voltage fluctuations of the bit line BL connected to the off cell are illustrated with a solid line.

At time t1, data sensed according to the first OCVS read operation is stored in a first latch set. When the develop operation of the sensing node SO is completed, a first latch signal LTCH_1 may be activated in the form of a pulse. In this case, a result of the OCVS read operation corresponding to a read voltage RD3 may be stored in the first latch set.

At time T1, a second OCVS read operation may start. At the precharge operation for the second OCVS read operation, a read voltage RD3_1 may be provided to the word lines of the selected memory cells. Furthermore, bit lines of the selected memory cells may be precharged with a changed bit line precharge voltage Vbl_2. The load signal LOAD may be activated with 0 V, and the control signal BLSHF may be provided with a second precharge control voltage Vpre_2. The second precharge control voltage Vpre_2 may be provided as a voltage higher than the first precharge control voltage Vpre_1 by a voltage difference ΔVS. In this case, it is described that a level of the second precharge control voltage Vpre_2 is higher than that of the first precharge control voltage Vpre_1. However, embodiments of the inventive concept are not limited thereto. That is, the second precharge control voltage Vpre_2 may be provided with a level lower than that of the first precharge control voltage Vpre_1. The transistor NM1 may be turned on by the second precharge control voltage Vpre_2. In this case, a channel size of the transistor NM1 may increase to be greater than that of the transistor NM1 at a point in time when the first precharge control voltage Vpre_1 is applied, and the amount of charge flowing into the bit line BL may relatively increase. Accordingly, the bit line BL may be precharged with the second bit line voltage Vbl_2 higher than the first bit line voltage Vbl_1 by a voltage difference ΔVb.

Next, at time t2, the develop operation of the second OCVS read operation may be performed. When the load signal LOAD is deactivated with the high level, the charge charged at the sensing node SO and the bit line BL may be discharged according to the program state of the memory cell. Next, at time t3, data sensed according to the second OCVS read operation is stored in a second latch set. When the develop operation of the sensing node SO is completed, the second latch signal LTCH_2 may be activated in the form of a pulse. In this case, the result of the OCVS read operation corresponding to the read voltage RD3 may be stored in the second latch set.

At time T2, a third OCVS read operation may start. At a precharge operation for the third OCVS read operation, the read voltage RD3_1 may be provided to the word lines of the selected memory cells. Furthermore, a changed bit line precharge voltage Vbl_3 may be provided to the bit lines of the selected memory cells. The load signal LOAD may be activated with 0 V, and the control signal BLSHF may be provided with a third precharge control voltage Vpre_3. The third precharge control voltage Vpre_3 may be provided as a voltage higher than the second precharge control voltage Vpre_2 by the voltage difference ΔVS. The transistor NM1 may be turned on by the third precharge control voltage Vpre_3. In this case, the channel size of the transistor NM1 may increase to be greater than that of the transistor NM1 at a point in time when the second precharge control voltage Vpre_2 is applied, and the amount of charge flowing into the bit line BL may relatively increase. Accordingly, the bit line BL may be precharged with the third bit line voltage Vbl_3 higher than the second bit line voltage Vbl_2 by the voltage difference ΔVb.

Next, at time t4, the develop operation of the third OCVS read operation may be performed. When the load signal LOAD is deactivated with the high level, the charge charged at the sensing node SO and the bit line BL may be discharged according to the program state of the memory cell. Next, at time t5, data sensed according to the third OCVS read operation is stored in a third latch set. When the develop operation of the sensing node SO is completed, a third latch signal LTCH_3 may be activated in the form of a pulse. In this case, the result of the OCVS read operation corresponding to the read voltage RD3 may be stored in the third latch set.

Afterwards, when results stored in the first to third latch sets are compared, one latch set may be selected. This comparison may be performed in an above-described manner described with reference to FIGS. 10A to 10C and 11A to 11D.

Above, it is described that the OCVS read operation is performed by changing a voltage of a precharged bit line. For example, a method of controlling a precharged voltage level by controlling the charge provided to the bit line or an amount of current is described. However, it should be understood to those skilled in the art that various methods of controlling a voltage of precharged bit line are used.

Figure 14:
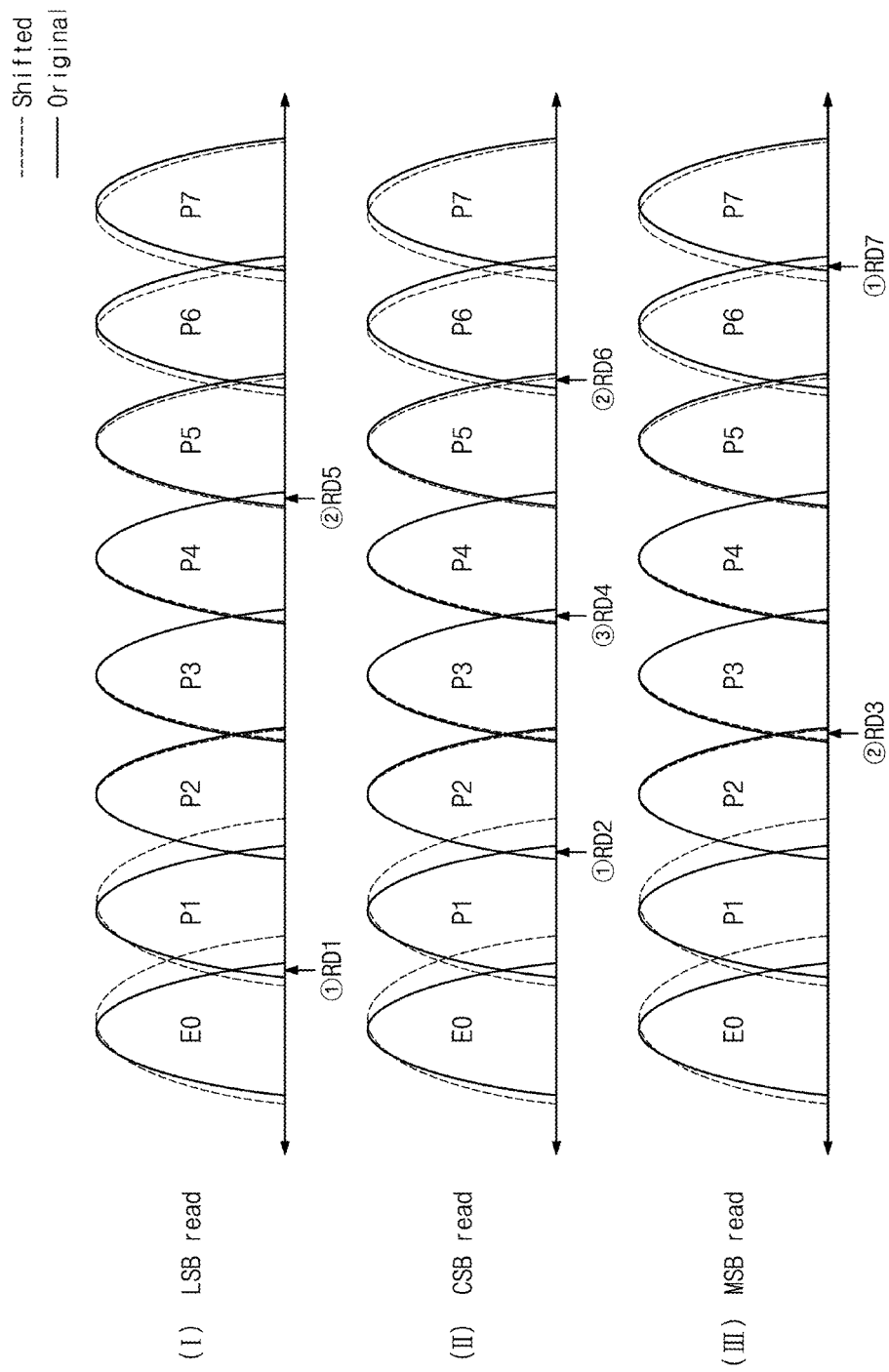
FIG. 14 is a schematic diagram for describing another timing diagram for describing an OCVS read operation according to example embodiments of inventive concepts.

FIG. 14 is a schematic diagram for describing another timing diagram for describing an OCVS read operation according to example embodiments of inventive concepts. Referring to FIG. 14, generally, the change of a threshold voltage distribution of memory cells may be differently illustrated according to a programmed state. For example, in the case of an erase state E0 or a lower program state P1, a distribution may tend to shift to the slight right side. Moreover, in the case of upper program states P6 and P7, the distribution may tend to spread in the slight left side. However, middle program states (e.g., P2, P3, P4, and P5) may have a slight difference, but the spread or shift of the distribution may be nearly disregarded. According to example embodiments of inventive concepts, a method of performing the OCVS read operation in view of a characteristic by an above-described program state. That is, when a data state in which the spread or shift of the distribution exists is read, a read operation of the OCVS read mode may be performed, and when a data state in which the spread or shift of the distribution is slight is read, a read operation of the OCVS read mode may be skipped. When the OCVS read operation is applied by a state, a read speed may be improved. The above-described trend of the spread or shift of a distribution may be an example. However, the scope and spirit of inventive concepts may not be limited thereto. For example, a read voltage and a read sequence to which the OCVS read operation is applied may be variously changed according to a characteristic of the distribution.

To distinguish a program state P1 from the erase state E0, the read voltage RD1 may be used during a read operation of an LSB page. Moreover, a sensed result of memory cells, each of which is determined as an on cell based on the read voltage RD5, from among memory cells determined as an off cell based on the read voltage RD1 may be maintained, and a state previously latched may be toggled in memory cells, each of which is determined as an off cell, from among memory cells determined as an off cell based on the read voltage RD1.

To read the LSB page, a read operation of the OCVS mode based on the read voltage RD1 may be performed prior to a read operation based on the read voltage RD5. During the read operation using the read voltage RD5, the OCVS mode may be deactivated, and a read operation may be performed once. A plurality of read results which are latched according to the result of the OCVS read operation may be processed according to the comparing and selecting operation during a read operation based on the read voltage RD5. Moreover, when a selected latch set is combined with another latch set sensed based on the read voltage RD5, the combined result may be outputted as a final read data of the LSB page.

To read a CSB page, the OCVS mode may be applied to a sensing and latching operation based on the read voltages RD2 and RD6. Moreover, during the read operation using the read voltage RD4, the OCVS mode may be deactivated, and a read operation may be performed once. To read the LSB page, a read operation of the OCVS mode based on the read voltage RD6 may be performed prior to a read operation based on the read voltage RD4. In this case, it may not matter which one of the read voltages RD2 and RD6 to which the OCVS mode are applied is applied first. Data sets latched according to the OCVS mode may be compared and selected in a pipeline manner. Moreover, when a latch set finally selected during a read operation based on the read voltage RD4 is combined with another latch set sensed based on the read voltage RD4, the combined result may be outputted as a final read data of the CSB page.

To read an MSB page, the OCVS mode may be applied to a sensing and latching operation based on the read voltage RD7. The read operation of the OCVS mode based on the read voltage RD7 may be performed prior to a read operation based on the read voltage RD3. Moreover, during the read operation using the read voltage RD3, the OCVS mode may be deactivated, and a read operation may be performed once. A plurality of read results which are latched according to the result of the OCVS read operation may be processed according to the comparing and selecting procedure during a read operation based on the read voltage RD3. Moreover, when a selected latch set is combined with another latch set sensed based on the read voltage RD3, the combined result may be outputted as a final read data of the MSB page.

FIG. 15 is a table for describing a feature of an OCVS read operation selectively applied according to a threshold voltage state illustrated in FIG. 14. Referring to FIG. 15, a read sequence for applying a selective OCVS to each of pages of a TLC may be classified by a page.

During a read operation of an LSB page, a read operation based on the read voltage RD5 may be performed after a read operation of the OCVS mode based on the read voltage RD1. To read the MSB page, a read operation, to which the OCVS mode is applied, based on the read voltage RD7 may be performed prior to a read operation based on the read voltage RD3. As the OCVS mode is applied to the read operation (e.g., the read operation based on the read voltage RD7) early performed, a cell counting and latch selecting operation using the result of the read operation (e.g., the read operation based on the read voltage RD3) late performed and the read operation early performed may be performed in a pipeline manner.

Moreover, during a read operation of a CSB page, the OCVS mode may be applied to a read operation based on the read voltages RD2 and RD6. Moreover, when a sensing operation is finally performed once based on the read voltage RD4, a cell counting and latch selecting operation using data previously latched may be performed in an OCVS mode. Accordingly, it may not matter which one of the read voltages RD2 and RD6 to which the OCVS mode are applied is applied first to a read operation.

Figure 16A:
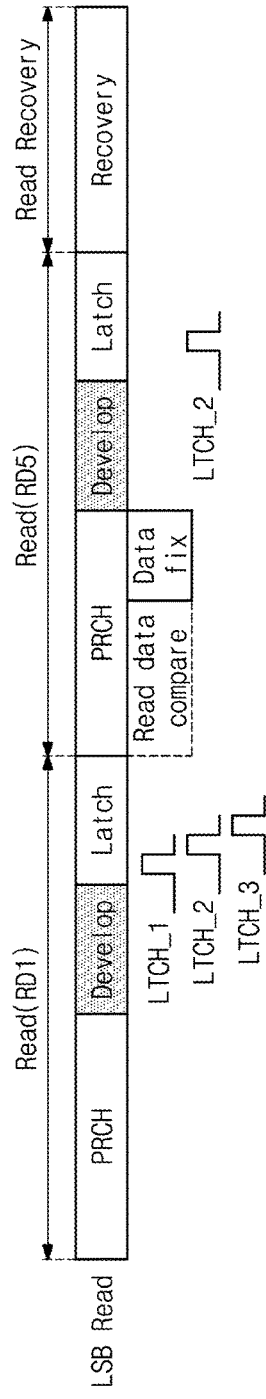
FIGS. 16A to 16C are timing diagrams for describing application of an selective OCVS read operation according to a sequence described in a table of FIG. 15 to each page.
Figure 16B:
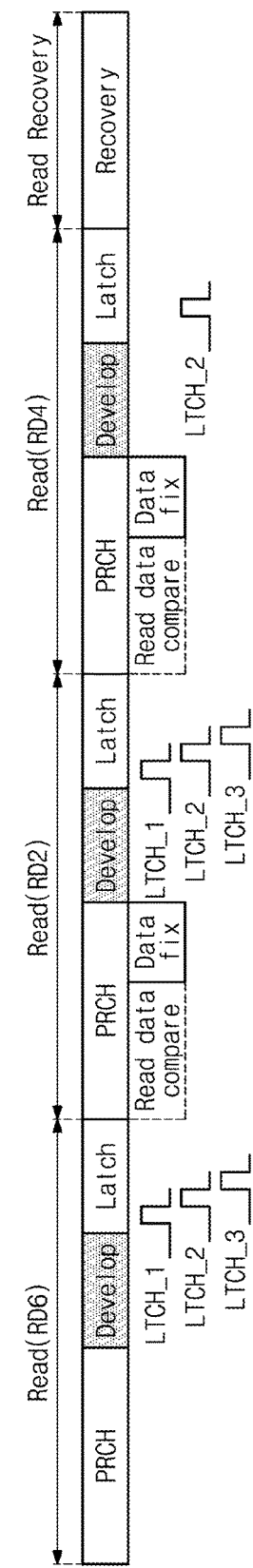
Figure 16C:
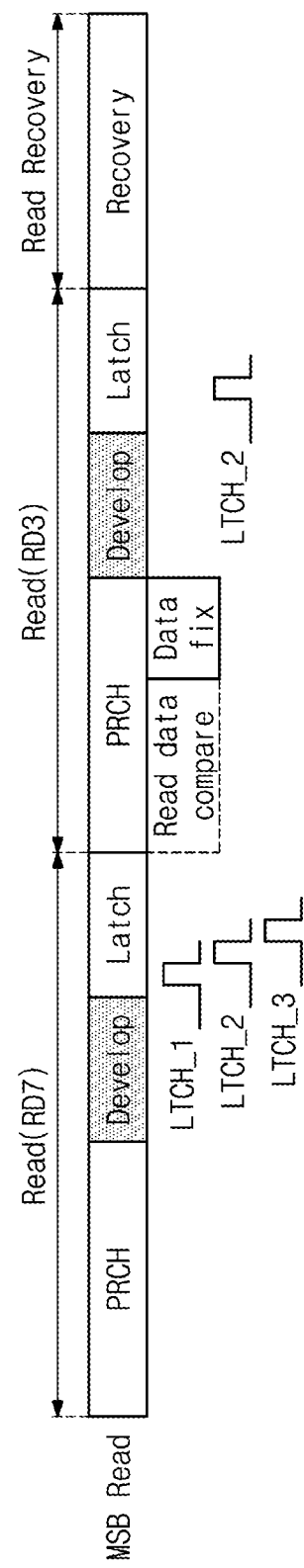

FIGS. 16A to 16C are timing diagrams for describing application of an selective OCVS read operation according to a sequence described in a table of FIG. 15 to each page.

Referring to FIG. 16A, to read an LSB page, a read operation of the OCVS mode based on the read voltage RD1 may be performed. First, a bit line and the sensing node SO of selected memory cells may be precharged (e.g., PRCH). Moreover, the latch signals LTCH_1, LTCH_2, and LTCH_3 may be sequentially provided at times when the sensing node SO is developed. Data may be stored in different latch sets in response to each of the latch signals LTCH_1, LTCH_2, and LTCH_3.

Next, a normal read operation based on the read voltage RD5 may be performed. A bit line and the sensing node SO of the selected memory cells may be precharged under the condition of the read voltage RD5 (e.g., PRCH). The comparing and selecting operation about the latch sets in which the result of a read operation previously performed is stored may be performed while a precharge operation is performed.

A develop operation about a bit line and the sensing node SO may be performed under the condition of the read voltage RD5, and a read result may be latched by one latch set, which is not selected, from among the latch sets. Afterwards, when a selected latch set is combined with a latch set in which data sensed based on the read voltage RD5 is stored, the combined result may be outputted as a read result of the LSB page. Afterwards, a read recovery may be made.

Referring to FIG. 16B, to read a CSB page, the OCVS mode may be applied to a read operation based on the read voltages RD2 and RD6. Moreover, during the read operation using the read voltage RD4, the OCVS mode may be deactivated. In FIG. 15B, a read operation based on the read voltage RD6 may be performed prior to a read operation based on the read voltage RD2. However, it may not matter that a read operation based on the read voltage RD2 is performed first.

A plurality of latching operations may occur during different develop periods under the condition of the read voltage RD6, and data latched during each latching operation may be stored in latch sets. Moreover, when a bit line and a sensing node are precharged under the condition of the read voltage RD2, data, which is stored in latch sets, which is previously latched may be compared with each other and one latch set may be selected. Moreover, when a bit line and a sensing node are precharged under the condition of the read voltage RD4, data, which is stored in latch sets, which is previously latched may be compared with each other and one latch set may be selected. A latch set finally selected may be combined with data finally latched under the condition of the read voltage RD4, and the combined result may be outputted as a read result of the CSB page.

Referring to FIG. 16C, to read an MSB page, a read operation of the OCVS mode based on the read voltage RD7 may be performed. Next, a normal read operation may be performed based on the read voltage RD7, a cell may be counted and a latch set may be selected during a precharge period of the normal read operation.

Above, selectively applying an OCVS read operation based on the characteristic of a data state according to example embodiments is described. In example embodiments, an OCVS mode may be applied not substantially reducing data reliability, and thus a high read performance may be provided.

Figure 17:
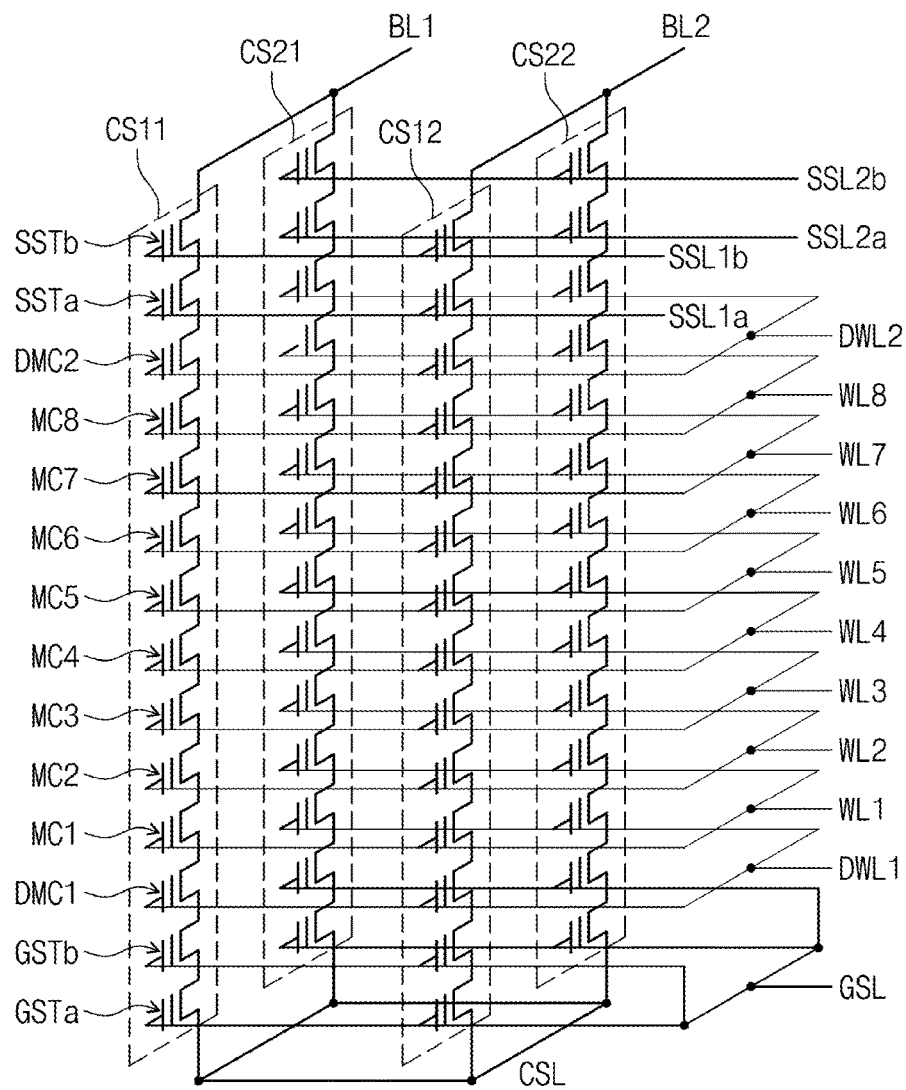
FIG. 17 is a circuit diagram illustrating a first memory block of memory blocks included in a memory cell array of FIG. 1.

FIG. 17 is a circuit diagram illustrating a first memory block BLK1 of memory blocks included in a memory cell array of FIG. 1. In example embodiments, a first memory block BLK1 having a three-dimensional structure will be described with reference to FIG. 16. However, the scope and spirit of inventive concepts may not be limited thereto. Referring to FIG. 16, the first memory block BLK1 may include a plurality of cell strings CS11, CS12, CS21, and CS22. The cell strings CS11, CS12, CS21, and CS22 may be arranged along a row direction and a column direction and may form rows and columns.

For example, the cell strings CS11 and CS12 may be connected to string selection lines SSL1a and SSL1b to form a first row. The cell strings CS21 and CS22 may be connected to string selection lines SSL2a and SSL2b to form a second row. For example, the cell strings CS11 and CS21 may be connected to a first bit line BL1 to form a first column. The cell strings CS12 and CS22 may be connected to a second bit line BL2 to form a second column.

Each of the cell strings CS11, CS12, CS21, and CS22 may include a plurality of cell transistors. Each of the cell strings CS11, CS12, CS21, and CS22 may include string selection transistors SSTa and SSTb, a plurality of memory cells MC1 to MC8, ground selection transistors GSTa and GSTb, and dummy memory cells DMC1 and DMC2. Each of the memory cells included in the cell strings CS11, CS12, CS21, and CS22 may be a charge trap flash (CTF) memory cell.

The memory cells MC1 to MC8 may be serially connected and may be stacked in a height direction being a direction perpendicular to a plane defined by the row direction and the column direction. The string selection transistors SSTa and SSTb may be serially connected and may be disposed between the memory cells MC1 to MC8 and a bit line BL. The ground selection transistors GSTa and GSTb may be serially connected and may be disposed between the memory cells MC1 to MC8 and a common source line CSL.

A first dummy memory cell DMC1 may be disposed between the memory cells MC1 to MC8 and the ground selection transistors GSTa and GSTb. A second dummy memory cell DMC2 may be disposed between the memory cells MC1 to MC8 and the string selection transistors SSTa and SSTb.

The ground selection transistors GSTa and GSTb of the cell strings CS11, CS12, CS21, and CS22 may be connected in common to a ground selection line GSL. Ground selection transistors in the same row may be connected to the same ground selection line, and ground selection transistors in different rows may be connected to different ground selection lines. For example, the first ground selection transistors GSTa of the cell strings CS11 and CS12 in the first row may be connected to the first ground selection line, and the first ground selection transistors GSTa of the cell strings CS21 and CS22 in the second row may be connected to the second ground selection line.

Although not shown, ground selection transistors at the same height from a substrate (not shown) may be connected to the same ground selection line, and ground selection transistors at different heights therefrom may be connected to different ground selection lines. For example, the first ground selection transistors GSTa of the cell strings CS11, CS12, CS21, and CS22 may be connected to the first ground selection line, and the second ground selection transistors GSTb thereof may be connected to the second ground selection line.

Memory cells placed at the same height from the substrate (or the ground selection transistors GSTa and GSTb) may be connected in common to the same word line, and memory cells placed at different heights therefrom may be connected to different word lines. For example, memory cells MC1 to MC8 of the cell strings CS11, CS12, CS21, and CS22 may be connected in common to first to eighth word lines WL1 to WL8.

String selection transistors, belonging to the same row, from among the first string selection transistors SSTa placed at the same height may be connected to the same string selection line, and string selection transistors belonging to different rows may be connected to different string selection lines. For example, the first string selection transistors SSTa of the cell strings CS11 and CS12 in the first row may be connected in common to the string selection line SSL1a, and the first string selection transistors SSTa of the cell strings CS21 and CS22 in the second row may be connected in common to the string selection line SSL1a.

Likewise, string selection transistors, belonging to the same row, from among the second string selection transistors SSTb at the same height may be connected to the same string selection line, and string selection transistors belonging to different rows may be connected to different string selection lines. For example, the second string selection transistors SSTb of the cell strings CS11 and CS12 in the first row may be connected in common to the string selection line SSL1b, and the second string selection transistors SSTb of the cell strings CS21 and CS22 in the second row may be connected in common to the string selection line SSL2b.

Although not shown, string selection transistors of cell strings in the same row may be connected in common to the same string selection line. For example, the first and second string selection transistors SSTa and SSTb of the cell strings CS11 and CS12 in the first row may be connected in common to the same string selection line. The first and second string selection transistors SSTa and SSTb of the cell strings CS21 and CS22 in the second row may be connected in common to the same string selection line.

In example embodiments, dummy memory cells at the same height may be connected with the same dummy word line, and dummy memory cells at different heights may be connected with different dummy word lines. For example, the first dummy memory cells DMC1 may be connected to a first dummy word line DWL1, and the second dummy memory cells DMC2 may be connected to a second dummy word line DWL2.

In the first memory block BLK1, read and write operations may be performed by the row. For example, one row of the memory block BLK1 may be selected by the string selection lines SSL1a, SSL1b, SSL2a, and SSL2b. The cell strings CS11 and CS12 in the first row may be respectively connected to the bit lines BL1 and BL2 when a turn-on voltage is supplied to the string selection lines SSL1a and SSL1b and a turn-off voltage is supplied to the string selection lines SSL2a and SSL2b. The cell strings CS21 and CS22 in the second row may be respectively connected to the bit lines BL1 and BL2 when the turn-on voltage is supplied to the string selection lines SSL2a and SSL2b and the turn-off voltage is supplied to the string selection lines SSL1a and SSL1b. As a word line is driven, memory cells, placed at the same height, from among memory cells in cell strings connected to the driven word line may be selected. Read and write operations may be performed with respect to the selected memory cells. The selected memory cells may constitute a physical page.

In the memory block BLK1, memory cells may be erased by the memory block or by the sub-block. When erasing is performed by the memory block, all memory cells MC in the memory block BLK1 may be simultaneously erased according to an erase request. When erasing is performed by the sub-block, a portion of memory cells MC in the memory block BLK1 may be simultaneously erased according to an erase request, and the other thereof may be erase-inhibited. A low voltage (e.g., a ground voltage) may be supplied to a word line connected to erased memory cells MC, and a word line connected to erase-inhibited memory cells MC may be floated.

The first memory block BLK1 illustrated in FIG. 17 may be an example. For example, the number of cell strings may increase or decrease, and the number of rows of cell strings and the number of columns of cell strings may increase or decrease according to the number of cell strings. In the first memory block BLK1, the number of cell strings (GST, MC, DMC, SST, or the like) may increase or decrease, and a height of the first memory block BLK1 may increase or decrease according to the number of cell strings (GST, MC, DMC, SST, or the like). Furthermore, the number of lines (GSL, WL, DWL, SSL, or the like) connected with cell transistors may increase or decrease according to the number of cell strings (GST, MC, DMC, SST, or the like).

Figure 18:
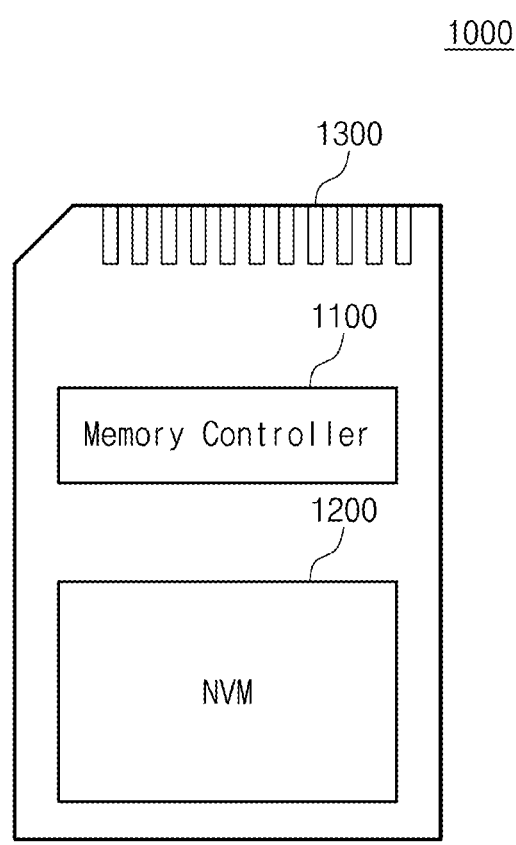
FIG. 18 is a block diagram illustrating a memory card system including a nonvolatile memory system according to example embodiments of inventive concepts.

FIG. 18 is a block diagram illustrating a memory card system including a nonvolatile memory system according to example embodiments of inventive concepts. Referring to FIG. 18, a memory card system 1000 may include a memory controller 1100, a nonvolatile memory 1200, and a connector 1300.

The memory controller 1100 may be connected to the nonvolatile memory 1200. The memory controller 1100 may be configured to access the nonvolatile memory 1200. For example, the memory controller 1100 may be configured to control an overall operation of the nonvolatile memory 1200 including, but not limited to, a read operation, a write operation, an erase operation, and a background operation. The background operation may include the following operations: wear-leveling management, garbage collection, and the like.

The memory controller 1100 may provide an interface between the nonvolatile memory 1200 and a host. The memory controller 1100 may be configured to drive firmware for controlling the nonvolatile memory 1200. In example embodiments, the memory controller 1100 may include components such as, but not limited to, a RAM, a processing unit, a host interface, a memory interface, and an error correction unit.

The memory controller 1100 may communicate with an external device through the connector 1300. The memory controller 1100 may communicate with an external device based on a specific communication protocol. For example, the memory controller 1100 may communicate with the external device through at least one of various communication protocols such as, but not limited to, universal serial bus (USB), multimedia card (MMC), eMMC (embedded MMC), peripheral component interconnection (PCI), PCI-express (PCI-E), advanced technology attachment (ATA), a serial-ATA, parallel-ATA, small computer small interface (SCSI), enhanced small disk interface (ESDI), integrated drive electronics (IDE), Firewire, universal flash storage (UFS), and nonvolatile memory express (NVMe). In example embodiments, a write command defined by the above-described standards may include size information of write data.

The nonvolatile memory 1200 may be implemented with a variety of nonvolatile memory devices, such as, but not limited to, an electrically erasable and programmable ROM (EEPROM), a NAND flash memory, a NOR flash memory, a phase-change RAM (PRAM), a resistive RAM (ReRAM), a ferroelectric RAM (FRAM), a spin-torque magnetic RAM (STT-MRAM), and the like.

In example embodiments, the memory controller 1100 and the nonvolatile memory 1200 may be integrated in a single semiconductor device. The memory controller 1100 and the nonvolatile memory 1200 may be integrated in a single semiconductor device to form a solid state drive (SSD). The memory controller 1100 and the nonvolatile memory 1200 may be integrated in a single semiconductor device to constitute a memory card. For example, the memory controller 1100 and the nonvolatile memory 1200 may be integrated in a single semiconductor device to compose a memory card such as, but not limited to, a PC card (a personal computer memory card international association (PCMCIA) card), a compact flash card (CF), a smart media card (SM, SMC), a memory stick, a multimedia card (MMC, RS-MMC, MMCmicro), an SD card (SD, miniSD, microSD, SDHC), and a universal flash storage (UFS).

Figure 19:
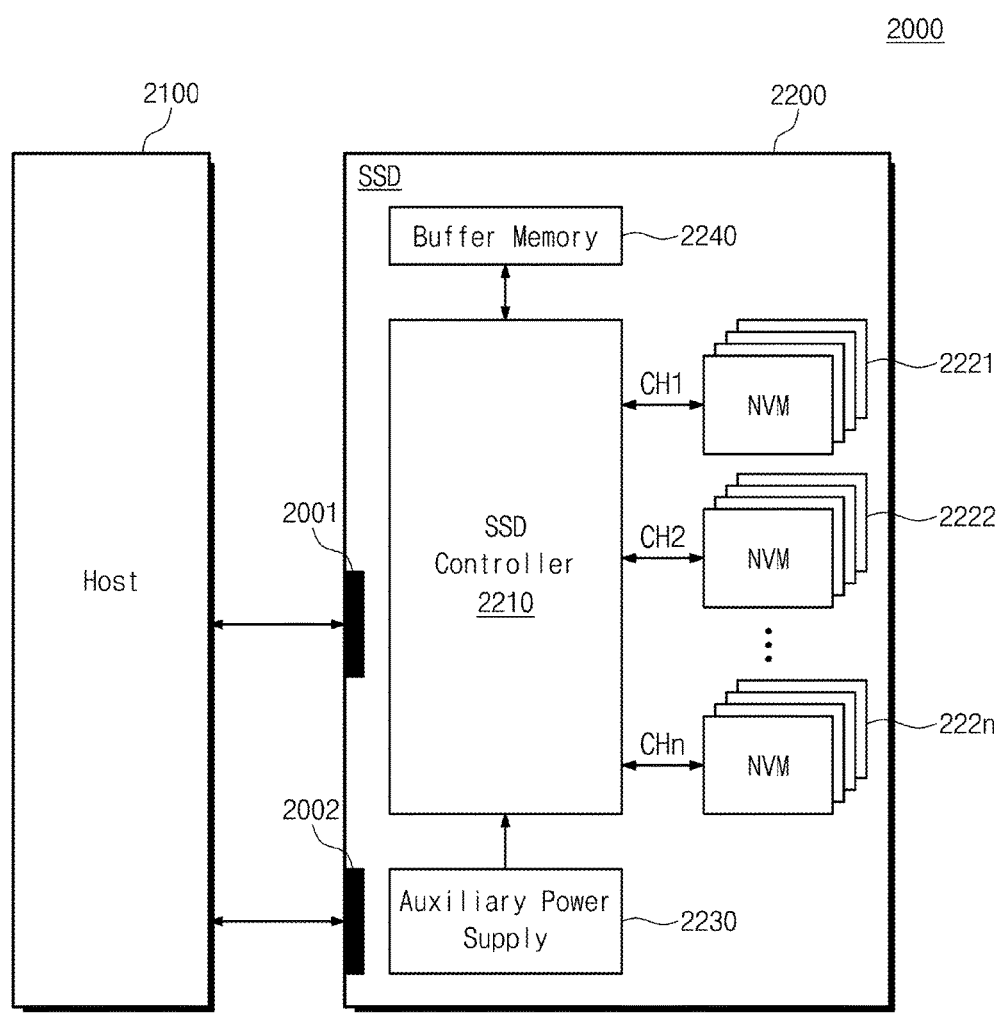
FIG. 19 is a block diagram illustrating a solid state drive (SSD) system including a nonvolatile memory system according to example embodiments of inventive concepts.

FIG. 19 is a block diagram illustrating a solid state drive (SSD) system including a nonvolatile memory system according to example embodiments of inventive concepts. Referring to FIG. 19, a solid state drive (SSD) system 2000 may include a host 2100 and an SSD 2200. The SSD 2200 may exchange signals with the host 2100 through a signal connector 2001 and may be supplied with a power through a power connector 2002. The SSD 2200 may include an SSD controller 2210, a plurality of flash memories 2221 to 222n, an auxiliary power supply 2230, and a buffer memory 2240.

The SSD controller 2210 may control the flash memories 2221 to 222n in response to the signal from the host 2100.

The auxiliary power supply 2230 may be connected to the host 2100 via the power connector 2002. The auxiliary power supply 2230 may receive the power from the host 2100 and may be charged by the power. When a power is not smoothly supplied from the host 2100, the auxiliary power supply 2230 may power the SSD system 2000. The auxiliary power supply 2230 may be placed inside or outside the SSD 2200. For example, the auxiliary power supply 2230 may be put on a main board to supply an auxiliary power to the SSD 2200.

The buffer memory 2240 may act as a buffer memory of the SSD 2200. For example, the buffer memory 2240 may temporarily store data received from the host 2100 or from the flash memories 2221 to 222n or may temporarily store metadata (e.g., mapping tables) of the flash memories 2221 to 222n. The buffer memory 2240 may include volatile memories such as a DRAM, a SDRAM, a DDR SDRAM, an LPDDR SDRAM, and an SRAM or nonvolatile memories such as a FRAM a ReRAM, a STT-MRAM, and a PRAM.

Figure 20:
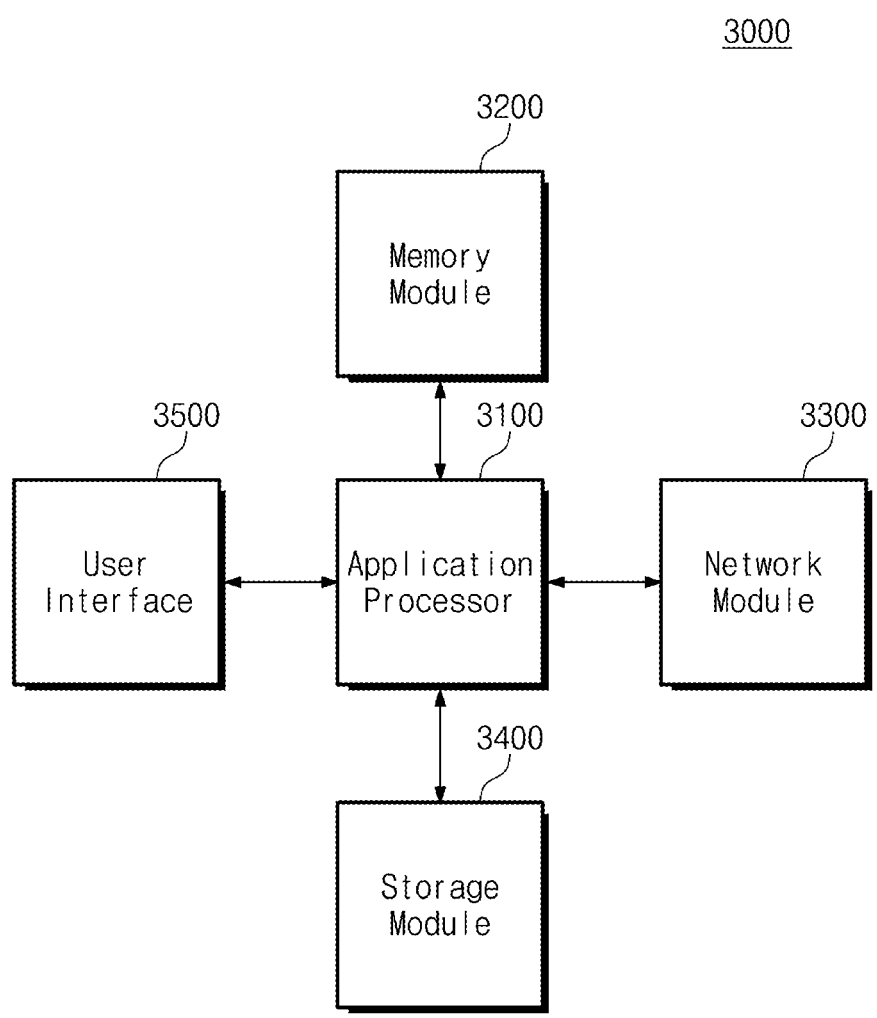
FIG. 20 is a block diagram illustrating a user system including a nonvolatile memory system according to example embodiments of inventive concepts.

FIG. 20 is a block diagram illustrating a user system including a nonvolatile memory system according to example embodiments of inventive concepts. Referring to FIG. 20, a user system 3000 may include an application processor 3100, a memory module 3200, a network module 3300, a storage module 3400, and a user interface 3500.

The application processor 3100 may drive components, an operating system, and the like of the user system 3000. For example, the application processor 3100 may include controllers for controlling components of the user system 3000, graphics engines, a variety of interfaces, and the like. For example, the application processor 3100 may be a system-on-chip (SoC).

The memory module 3200 may operate as a main memory, a working memory, a buffer memory, or a cache memory of the user system 3000. The memory module 3200 may be implemented with a volatile random access memory, such as DRAM, SDRAM, double date rate DRAM (DDR SDRAM), DDR2 SDRAM, DDR3 SDRAM, LPDDR DRAM, LPDDR2 DRAM, or LPDDR3 DRAM or a nonvolatile random access memory, such as PRAM, MRAM, RRAM, or FRAM.

The network module 3300 may communicate with external devices. For example, the network module 3300 may support wireless communications, such as code division multiple access (CDMA), global system for mobile communication (GSM), wideband CDMA (WCDMA), CDMA-2000, time division multiple access (TDMA), long term evolution (LTE), Wimax, WLAN, UWB, Bluetooth, WI-DI, and the like. In example embodiments, the network module 3300 may be included in the application processor 3100.

The storage module 3400 may store data. For example, the storage module 3400 may store data received from the application processor 3100. Alternatively, the storage module 3400 may provide the application processor 3100 with data stored therein. For example, the storage module 3400 may be implemented with a semiconductor memory device such as PRAM, MRAM, RRAM, NAND flash memory, NOR flash memory, or a three-dimensional NAND flash memory.

The user interface 3500 may include interfaces which input data or a command in the application processor 3100 or output data to an external device. For example, the user interface 3500 may include user input interfaces such as a keyboard, a keypad, buttons, a touch panel, a touch screen, a touch pad, a touch ball, a camera, a microphone, a gyroscope sensor, a vibration sensor, and the like. The user interface 3500 may further include user output interfaces such as a liquid crystal display (LCD), an organic light-emitting diode (OLED) display device, an active matrix OLED (AMOLED) display device, a light-emitting diode (LED), a speaker, and a motor.

A nonvolatile memory device, a card controller, and a memory card according to the inventive concept may be packaged according to any of a variety of different packaging technologies. Examples of such packaging technologies may include the following: package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), small outline (SOIC), shrink small outline package (SSOP), thin small outline (TSOP), thin quad flatpack (TQFP), system in package (SIP), multi-chip package (MCP), wafer-level fabricated package (WFP), and wafer-level processed stack package (WSP).

According to example embodiments of inventive concepts, in a nonvolatile memory device, a plurality of sensing operations may be performed to determine a specific data state, and data, of which the number of error bits reduced (and/or minimized), from among data latched at each operation may be outputted. Accordingly, the data reliability of the nonvolatile memory device may be markedly improved, when the technology according to example embodiments of inventive concepts is applied to the nonvolatile memory device. In addition, the read performance of the nonvolatile memory device may be improved.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A nonvolatile memory device, comprising:
   a cell array including a plurality of memory cells;
   a plurality of bit lines connected to the cell array;
   a page buffer including a plurality of latch sets,
   the page buffer being connected to the cell array through the bit lines, the latch sets respectively being configured to sense data from selected memory cells among the memory cells through the bit lines, the latch sets respectively being configured to perform a plurality of read operations to determine one data state, and the latch sets respectively being configured to store results of the read operations; and a control logic configured to control the page buffer such that the latch sets sequentially and respectively store the results of the read operations, to compare data stored in the latch sets with each other to obtain a comparison result, and to select one latch set among the latch sets based on the comparison result.

2. The nonvolatile memory device of claim 1, wherein the page buffer is configured to perform the read operations with respect to the selected memory cells during different develop periods.

3. The nonvolatile memory device of claim 2, further comprising:
   word lines; and
   a row decoder connected to the cell array through the word lines,
   wherein the row decoder is configured to provide a read voltage of a same level to selected word lines among the word lines that are connected to the selected memory cells.

4. The nonvolatile memory device of claim 1, further comprising:
   word lines; and
   a row decoder connected to the cell array through the word lines, wherein the page buffer is configured to perform the read operations using read voltages of different levels provided to a word line connected to the selected memory cells among the word lines.

5. The nonvolatile memory device of claim 1, wherein the page buffer includes:
   a first latch set configured to store first data sensed and latched according to a first read operation about the selected memory cells; and
   a second latch set configured to store second data sensed and latched according to a second read operation about the selected memory cells, wherein
   the control logic is configured to compare the first data with the second data to select one of the first data and the second data.

6. The nonvolatile memory device of claim 5, wherein the control logic is configured to select the one of the first data and the second data, based on comparing a number of on cells counted using the first data with a number of off cells counted using the second data.

7. The nonvolatile memory device of claim 6, wherein the control logic is configured to select the second data if the number of on cells is greater than the number of off cells.

8. The nonvolatile memory device of claim 1, wherein the page buffer includes,
   a first latch set configured to store first data sensed and latched according to a first read operation about the selected memory cells,
   a second latch set configured to store second data sensed and latched according to a second read operation about the selected memory cells, and
   a third latch set configured to store third data sensed and latched according to a third read operation about the selected memory cells,
   the control logic is configured to calculate a first cell count by comparing the first data with the second data, and the control logic is configured to calculate a second cell count by comparing the second data with the third data.

9. The nonvolatile memory device of claim 8, wherein the control logic is configured to select the third data if the first cell count is greater than the second cell count.

10. The nonvolatile memory device of claim 8, wherein the control logic is configured to select the first data if the first cell count is smaller than the second cell count.

11. The nonvolatile memory device of claim 8, wherein the control logic is configured to select the second data if the first cell count is equal to the second cell count or a difference between the first cell count and the second cell count is smaller than or equal to a reference value.

12. The nonvolatile memory device of claim 1, further comprising:
    a cell counter configured to count a number of cells by comparing data stored in the latch sets with each other.

13. The nonvolatile memory device of claim 1, wherein the control logic is configured to selectively apply the read operations based on a level of a read voltage for determining the one data state.

14. The nonvolatile memory device of claim 1, wherein each of the memory cells includes a charge trap layer, and the cell array is a three-dimensional memory array.

15. A method of reading a nonvolatile memory device, the method comprising:
    storing first data in a first latch set of a page buffer, the first data obtained by performing a first read operation using a first read voltage for determining a data state of selected memory cells;
    storing second data in a second latch set of the page buffer, the second data obtained by performing a second read operation using the first read voltage for determining the data state of the selected memory cells;
    counting a number of memory cells based on comparing the first data with the second data;
    selecting one of the first data and the second data based on the counted number of memory cells; and
    performing a third read operation for determining the data state of the selected memory cells using a second read voltage different from the first read voltage,
    wherein the counting and the selecting are performed during the third read operation.

16. The method of claim 15, wherein the first data is sensed during a first develop time of the selected memory cells and stored in the first latch set, the second data is sensed during a second develop time of the selected memory cells and stored in the second latch set, and the first develop time is shorter than the second develop time.

17. The method of claim 16, wherein the first develop time and the second develop time are included in a develop period.

18. The method of claim 15, wherein the selecting the one of the first data and the second data includes:
    comparing a number of on cells counted using the first data with a number of off cells counted using the second data to select the one of the first data and the second data.

19. A method of reading a nonvolatile memory device, the method comprising:
    storing first data in a first latch set of a page buffer, the first data obtained by performing a first read operation for determining a data state of selected memory cells;
    storing second data in a second latch set of the page buffer, the second data obtained by performing a second read operation for determining the data state of the selected memory cells;

storing third data in a third latch set of the page buffer, the third data obtained by performing a third read operation for determining the data state of the selected memory cells;

calculating a first cell count using the first data and the second data;

calculating a second cell count based on the second data and the third data; and selecting one of the first data, the second data, and the third data based on the first cell count and the second cell count.

20. The method of claim 19, wherein each of the first read operation, second read operation, and third read operation include operations to sense whether the selected memory cells are turned on or off during different develop periods under a same read voltage condition.

* * * * *